(12) United States Patent
Parkhe et al.

(10) Patent No.: US 9,472,435 B2
(45) Date of Patent: Oct. 18, 2016

(54) TUNABLE TEMPERATURE CONTROLLED SUBSTRATE SUPPORT ASSEMBLY

(71) Applicant: Applied Materials, Inc., Santa Clara, CA (US)

(72) Inventors: Vijay D. Parkhe, San Jose, CA (US); Steven E. Babayan, Los Altos, CA (US); Konstantin Makhratchev, Fremont, CA (US); Zhiqiang Guo, Sunnyvale, CA (US); Phillip R. Sommer, Newark, CA (US); Dan A. Marohl, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/717,676

(22) Filed: May 20, 2015

(65) Prior Publication Data

US 2016/0027678 A1    Jan. 28, 2016

Related U.S. Application Data

(60) Provisional application No. 62/028,693, filed on Jul. 24, 2014, provisional application No. 62/028,260, filed on Jul. 23, 2014.

(51) Int. Cl.
*F27B 5/14* (2006.01)
*H01L 21/683* (2006.01)
*H05B 3/02* (2006.01)
*H01L 21/67* (2006.01)
*H05B 1/02* (2006.01)

(52) U.S. Cl.
CPC ..... *H01L 21/6833* (2013.01); *H01L 21/67103* (2013.01); *H01L 21/67248* (2013.01); *H01L 21/6831* (2013.01); *H05B 1/023* (2013.01); *H05B 3/02* (2013.01)

(58) Field of Classification Search
CPC .......... H01L 21/6833; H01L 21/6831; H01L 21/67248; H01L 21/67103; H01L 21/68714; H01L 21/76804; H01L 21/76805; H01L 21/76877; H01B 3/02; H01B 3/026; H01B 3/023
See application file for complete search history.

(56) References Cited

U.S. PATENT DOCUMENTS

| | | | |
|---|---|---|---|
| 6,490,146 B2 | 12/2002 | Wang et al. | |
| 6,538,872 B1 | 3/2003 | Wang et al. | |
| 6,740,853 B1 | 5/2004 | Johnson et al. | |
| 8,226,769 B2 | 7/2012 | Matyushkin et al. | |

(Continued)

OTHER PUBLICATIONS

International Search Report and Written Opinion for PCT/US2015/029725 dated Aug. 19, 2015.

(Continued)

*Primary Examiner* — Shawntina Fuqua
(74) *Attorney, Agent, or Firm* — Patterson & Sheridan, LLP

(57) ABSTRACT

Implementations described herein provide a substrate support assembly which enables both lateral and azimuthal tuning of the heat transfer between an electrostatic chuck and a heating assembly. The substrate support assembly comprises a body having a substrate support surface and a lower surface, one or more main resistive heaters disposed in the body, a plurality of spatially tunable heaters disposed in the body, and a spatially tunable heater controller coupled to the plurality of spatially tunable heaters, the spatially tunable heater controller configured to independently control an output one of the plurality of spatially tunable heaters relative to another of the plurality of spatially tunable heaters.

18 Claims, 11 Drawing Sheets

(56) References Cited

U.S. PATENT DOCUMENTS

| | | |
|---|---|---|
| 8,461,674 B2 | 6/2013 | Gaff et al. |
| 8,546,732 B2 | 10/2013 | Singh |
| 8,587,113 B2 | 11/2013 | Gaff et al. |
| 8,624,168 B2 | 1/2014 | Gaff et al. |
| 8,637,794 B2 | 1/2014 | Singh et al. |
| 8,663,391 B2 | 3/2014 | Matyushkin et al. |
| 8,884,194 B2 | 11/2014 | Singh et al. |
| 8,937,800 B2 | 1/2015 | Lubomirsky et al. |
| 9,196,514 B2 | 11/2015 | Parkhe et al. |
| 2008/0017104 A1 | 1/2008 | Matyushkin et al. |
| 2009/0274590 A1 | 11/2009 | Willwerth et al. |
| 2010/0163188 A1 | 7/2010 | Tanaka et al. |
| 2011/0147363 A1 | 6/2011 | Yap et al. |
| 2012/0285619 A1* | 11/2012 | Matyushkin ...... H01L 21/67109 156/345.1 |
| 2013/0161305 A1* | 6/2013 | Ptasienski ............. H05B 3/20 219/201 |
| 2013/0220989 A1 | 8/2013 | Pease et al. |
| 2013/0269368 A1 | 10/2013 | Gaff et al. |
| 2014/0020834 A1 | 1/2014 | Zhou et al. |
| 2014/0045337 A1 | 2/2014 | Singh et al. |
| 2014/0047705 A1 | 2/2014 | Singh et al. |
| 2014/0048529 A1 | 2/2014 | Pease |
| 2014/0096909 A1 | 4/2014 | Singh et al. |
| 2014/0154819 A1 | 6/2014 | Gaff et al. |
| 2015/0129165 A1 | 5/2015 | Parkhe et al. |
| 2015/0155193 A1 | 6/2015 | Hsu et al. |
| 2015/0170977 A1 | 6/2015 | Singh |
| 2015/0187625 A1 | 7/2015 | Busche et al. |
| 2015/0187626 A1 | 7/2015 | Parkhe et al. |
| 2015/0228513 A1 | 8/2015 | Parkhe et al. |
| 2015/0311105 A1 | 10/2015 | Sadjadi et al. |
| 2015/0364354 A1 | 12/2015 | Tantiwong et al. |
| 2015/0366004 A1 | 12/2015 | Nangoy et al. |
| 2016/0027678 A1 | 1/2016 | Parkhe et al. |

OTHER PUBLICATIONS

International Search Report to PCT/US2015/010468 dated Apr. 28, 2015, 13 pgs.

International Search Report and Written Opinion for PCT/US2014/064735 dated Feb. 24, 2015, 15 pgs.

* cited by examiner

TUNABLE TEMPERATURE CONTROLLED SUBSTRATE SUPPORT ASSEMBLY

CROSS-REFERENCE TO RELATED APPLICATIONS

This application claims benefit of U.S. Provisional Application Ser. No. 62/028,693, filed on Jul. 24, 2014 and U.S. Provisional Application Ser. No. 62/028,260, filed on Jul. 23, 2014, both of which are incorporated by reference in their entirety.

BACKGROUND

1. Field

Implementations described herein generally relate to semiconductor manufacturing and more particularly to temperature controlled substrate support assembly and method of using the same.

2. Description of the Related Art

As the feature size of the device patterns get smaller, the critical dimension (CD) requirements of these features become a more important criterion for stable and repeatable device performance. Allowable CD variation across a substrate processed within a processing chamber is difficult to achieve due to chamber asymmetries such as chamber and substrate temperature, flow conductance, and RF fields.

In processes utilizing an electrostatic chuck, uniformity of temperature control across the surface of the substrate is even more challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. Since the structure of the electrostatic chuck can vary both laterally and azimuthally, uniformity of heat transfer between the chuck and substrate is complicated and very difficult to obtain, resulting in local hot and cold spots across the chuck surface, which consequently result in non-uniformity of processing results along the surface of the substrate.

The lateral and azimuthal uniformity of heat transfer between the chuck and substrate is further complicated by heat transfer schemes commonly utilized in conventional substrate supports to which the electrostatic chuck is mounted. For example, conventional substrate supports typically have only edge to center temperature control. Thus, local hot and cold spots within the electrostatic chuck cannot be compensated for while utilizing the heat transfer features of the conventional substrate supports.

Thus, there is a need for an improved substrate support assembly.

SUMMARY

Implementations described herein provide a substrate support assembly which enables both lateral and azimuthal tuning of the heat transfer between an electrostatic chuck and a heating assembly. The substrate support assembly comprises a body having a substrate support surface and a lower surface, one or more main resistive heaters disposed in the body, a plurality of spatially tunable heaters disposed in the body, and a tuning heater controller coupled to the plurality of spatially tunable heaters, the tuning heater controller configured to independently control an output for one of the plurality of spatially tunable heaters relative to another of the plurality of spatially tunable heaters.

In one embodiment, a substrate support assembly comprises a substrate a cooling base with slots formed therethrough, a body having a substrate support surface and a lower surface, one or more main resistive heaters disposed in the body, a plurality of spatially tunable heaters disposed in the body, and a tunable heater controller coupled to the plurality of spatially tunable heaters, the tuning heater controller configured to independently control an output for one of the plurality of spatially tunable heaters relative to another of the plurality of spatially tunable heaters.

In yet another embodiment, a method for controlling the temperature of a workpiece is provided. The method, includes applying power to a main resistive heater formed in a substrate support; providing power to a plurality of spatially tunable heaters, wherein power to each spatially tunable heater is individually controlled by a tuning heater controller; processing a workpiece on the substrate support; and changing the power provided to individual spatially tunable heater in response to process conditions or changes in a process recipe.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a substrate support assembly which enables both lateral and azimuthal tuning of the temperature of an electrostatic chuck comprising the substrate support assembly, which in turn, allows both lateral and azimuthal tuning of the lateral temperature profile of a substrate processed on the substrate support assembly. Moreover, the substrate support assembly also enables local hot or cold spots on the substrate to be substantially eliminated. Methods for tuning of a lateral temperature profile a substrate processed on a substrate support assembly are also described herein. Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where azimuthal tuning of a lateral temperature profile is desirable. It is also contemplated that the spatially tunable heaters may also be utilized to control the temperature of other surfaces, including those not used for semiconductor processing.

In one or more embodiments, the substrate support assembly allows for the correction of critical dimension (CD) variation at the edge of the substrate during vacuum process, such as etching, deposition, implantation and the like, by allowing the substrate temperature to be utilized to compensate for chamber non-uniformities, such as temperature, flow conductance, electrical fields, plasma density and the like. Additionally, some embodiments have demonstrated the ability to control the temperature uniformity across the substrate to less than about ±0.3 degrees Celsius.

Figure 1:
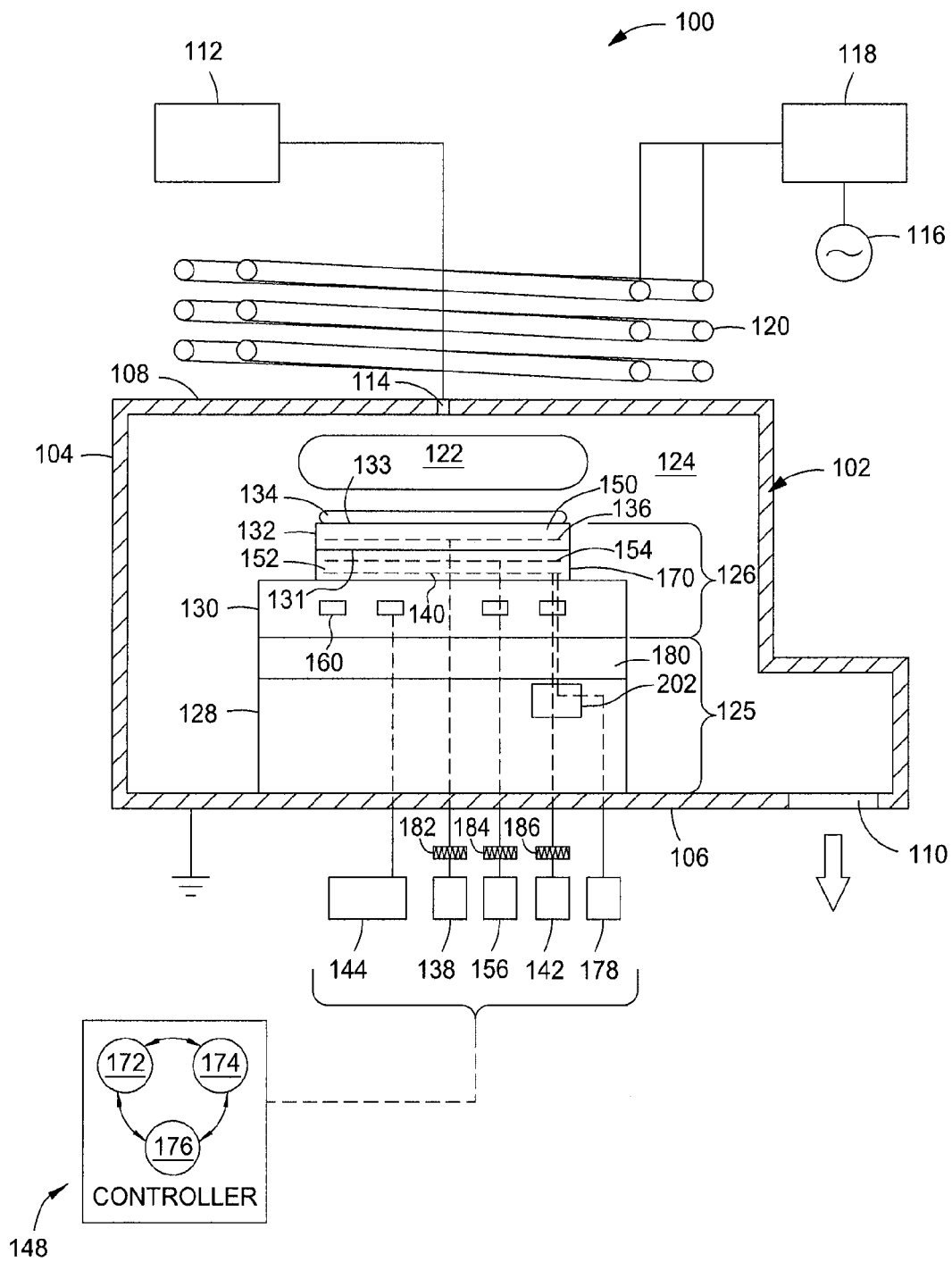
FIG. 1 is a cross-sectional schematic side view of a processing chamber having one embodiment of a substrate support assembly.

FIG. 1 is a cross-sectional schematic view of an exemplary etch processing chamber 100 having a substrate support assembly 126. As discussed above, the substrate support assembly 126 may be utilized in other processing chamber, for example plasma treatment chambers, annealing chambers, physical vapor deposition chambers, chemical vapor deposition chambers, and ion implantation chambers, among others, as well as other systems where the ability to control a temperature profile of a surface or workpiece, such as a substrate, is desirable. Independent and local control of the temperature across many discrete regions across a surface beneficially enables azimuthal tuning of the temperature profile, center to edge tuning of the temperature profile, and reduction of local temperature asperities, such as hot and cool spots.

The processing chamber 100 includes a grounded chamber body 102. The chamber body 102 includes walls 104, a bottom 106 and a lid 108 which enclose an internal volume 124. The substrate support assembly 126 is disposed in the internal volume 124 and supports a substrate 134 thereon during processing.

The walls 104 of the processing chamber 100 include an opening (not shown) through which the substrate 134 may be robotically transferred into and out of the internal volume 124. A pumping port 110 is formed in one of the walls 104 or the bottom 106 of the chamber body 102 and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the lid 108 or walls 104 of the chamber body 102. The process gas provided by the gas panel 112 are energized within the internal volume 124 to form a plasma 122 utilized to process the substrate 134 disposed on the substrate support assembly 126. The process gases may be energized by RF power inductively coupled to the process gases from a plasma applicator 120 positioned outside the chamber body 102. In the embodiment depicted in FIG. 1, the plasma applicator 120 is a pair of coaxial coils coupled through a matching circuit 118 to an RF power source 116.

A controller 148 is coupled to the processing chamber 100 to control operation of the processing chamber 100 and processing of the substrate 134. The controller 148 may be one of any form of general-purpose data processing system that can be used in an industrial setting for controlling the various subprocessors and subcontrollers. Generally, the controller 148 includes a central processing unit (CPU) 172 in communication with memory 174 and input/output (I/O) circuitry 176, among other common components. Software commands executed by the CPU of the controller 148, cause the processing chamber to, for example, introduce an etchant gas mixture (i.e., processing gas) into the internal volume 124, form the plasma 122 from the processing gas by application of RF power from the plasma applicator 120, and etch a layer of material on the substrate 134.

The substrate support assembly 126 generally includes at least a substrate support 132. The substrate support 132 may be a vacuum chuck, an electrostatic chuck, a susceptor, or other workpiece support surface. In the embodiment of FIG. 1, the substrate support 132 is an electrostatic chuck and will be described hereinafter as the electrostatic chuck 132. The substrate support assembly 126 may additionally include a heater assembly 170. The substrate support assembly 126 may also include a cooling base 130. The cooling base may alternately be separate from the substrate support assembly 126. The substrate support assembly 126 may be removably coupled to a support pedestal 125. The support pedestal 125, which may include a pedestal base 128 and a facility plate 180, is mounted to the chamber body 102. The substrate support assembly 126 may be periodically removed from the support pedestal 125 to allow for refurbishment of one or more components of the substrate support assembly 126.

The facility plate 180 is configured to accommodate a plurality of driving mechanism configured to raise and lower a plurality of lifting pins. Additionally, the facility plate 180 is configured to accommodate the plurality of fluid connections from the electrostatic chuck 132 and the cooling base 130. The facility plate 180 is also configured to accommodate the plurality of electrical connections from the electrostatic chuck 132 and the heater assembly 170. The myriad of connections may run externally or internally of the substrate support assembly 126 while the facility plate 180 provides an interface for the connections to a respective terminus.

The electrostatic chuck 132 has a mounting surface 131 and a workpiece surface 133 opposite the mounting surface 131. The electrostatic chuck 132 generally includes a chucking electrode 136 embedded in a dielectric body 150. The chucking electrode 136 may be configured as a mono polar or bipolar electrode, or other suitable arrangement. The chucking electrode 136 is coupled through an RF filter 182 to a chucking power source 138 which provides a RF or DC power to electrostatically secure the substrate 134 to the upper surface of the dielectric body 150. The RF filter 182 prevents RF power utilized to form a plasma 122 within the processing chamber 100 from damaging electrical equipment or presenting an electrical hazard outside the chamber. The dielectric body 150 may be fabricated from a ceramic material, such as AlN or $Al_2O_3$. Alternately, the dielectric body 150 may be fabricated from a polymer, such as polyimide, polyetheretherketone, polyaryletherketone and the like.

The workpiece surface 133 of the electrostatic chuck 132 may include gas passages (not shown) for providing backside heat transfer gas to the interstitial space defined between the substrate 134 and the workpiece surface 133 of the electrostatic chuck 132. The electrostatic chuck 132 may also include lift pin holes for accommodating lift pins (both not shown) for elevating the substrate 134 above the workpiece surface 133 of the electrostatic chuck 132 to facilitate robotic transfer into and out of the processing chamber 100.

The temperature controlled cooling base 130 is coupled to a heat transfer fluid source 144. The heat transfer fluid source 144 provides a heat transfer fluid, such as a liquid, gas or combination thereof, which is circulated through one or more conduits 160 disposed in the cooling base 130. The fluid flowing through neighboring conduits 160 may be isolated to enabling local control of the heat transfer between the electrostatic chuck 132 and different regions of the cooling base 130, which assists in controlling the lateral temperature profile of the substrate 134.

A fluid distributor may be fluidly coupled between an outlet of the heat transfer fluid source 144 and the temperature controlled cooling base 130. The fluid distributor operates to control the amount of heat transfer fluid provided to the conduits 160. The fluid distributor may be disposed outside of the processing chamber 100, within the substrate support assembly 126, within the pedestal base 128 or other suitable location.

The heater assembly 170 may include one or more main resistive heaters 154 and/or a plurality of spatially tunable heaters 140 embedded in a body 152. The main resistive heaters 154 may be provided to elevate the temperature of the substrate support assembly 126 to a temperature for conducting chamber processes. The spatially tunable heaters 140 are complimentary to the main resistive heaters 154 and configured to adjust the localized temperature of the electrostatic chuck 132 in a plurality of discrete locations within any one or more of a plurality of laterally separated heating zones defined by the main resistive heaters 154. The spatially tunable heaters 140 provide localized adjustments to the temperature profile of a substrate placed on the substrate support assembly 126. Thus, the main resistive heaters 154 operate on a globalized macro scale while the spatially tunable heaters 140 operate on a localized micro scale.

The main resistive heaters 154 are coupled through an RF filter 184 to a main heater power source 156. The power source 156 may provide 900 watts or more power to the main resistive heaters 154. The controller 148 may control the operation of the main heater power source 156, which is generally set to heat the substrate 134 to about a predefined temperature. In one embodiment, the main resistive heaters 154 include laterally separated heating zones, wherein the controller 148 enables one zone of the main resistive heaters 154 to be preferentially heated relative to the main resistive heaters 154 located in one or more of the other zones. For example, the main resistive heaters 154 may be arranged concentrically in a plurality of separated heating zones.

The spatially tunable heaters 140 are coupled through an RF filter 186 to a tuning heater power source 142. The tuning heater power source 142 may provide 10 watts or less power to the spatially tunable heaters 140. In one embodiment, the power supplied by the tuning heater power source 142 is an order of magnitude less than the power supplied by the power source 156 of the main resistive heaters. The spatially tunable heaters 140 may additionally be coupled to a tuning heater controller 202. The tuning heater controller 202 may be located within or external to the substrate support assembly 126. The tuning heater controller 202 may manage the power provided from the tuning heater power source 142 to individual or groups of spatially tunable heaters 140 in order to control the heat generated locally at each spatially tunable heaters 140 distributed laterally across the substrate support assembly 126. The tuning heater controller 202 is configured to independently control an output one of the plurality of spatially tunable heaters 140 relative to another of the plurality of spatially tunable heaters 140. An optical converter 178 may coupled the tuning heater controller 202 to the controller 148 to decouple the controller 148 from influence of the RF energy with the processing chamber 100.

In one embodiment, the one or more main resistive heaters 154, and/or the spatially tunable heaters 140, may be formed in the electrostatic chuck 132. The substrate support assembly 126 may be formed without the heater assembly 170 with the electrostatic chuck 132 disposed directly on the cooling base 130. The tuning heater controller 202 may be disposed adjacent to the cooling base and selectively control individual spatially tunable heaters 140.

The electrostatic chuck 132 may include one or more temperature sensors (not shown) for providing temperature feedback information to the controller 148 for controlling the power applied by the main heater power source 156 to the main resistive heaters 154, for controlling the operations of the cooling base 130, and controlling the power applied by the tuning heater power source 142 to the spatially tunable heaters 140.

The temperature of the surface for the substrate 134 in the processing chamber 100 may be influenced by the evacuation of the process gasses by the pump, the slit valve door, the plasma 122 and other factors. The cooling base 130, the one or more main resistive heaters 154, and the spatially tunable heaters 140 all help to control the surface temperature of the substrate 134.

In a two zone configuration of main resistive heaters 154, the main resistive heaters 154 may be used to heat the substrate 134 to a temperature suitable for processing with a variation of about +/−10 degrees Celsius from one zone to another. In a four zone assembly for the main resistive heaters 154, the main resistive heaters 154 may be used to heat the substrate 134 to a temperature suitable for processing with a variation of about +/−1.5 degrees Celsius within a particular zone. Each zone may vary from adjacent zones from about 0 degrees Celsius to about 20 degrees Celsius depending on process conditions and parameters. However, the requirement for minimizing variations in the critical dimensions across a substrate has reduced the acceptable variation in a determined process temperature of the surface of the substrate surface. A half a degree variation of the surface temperature for the substrate 134 may result in as much as a nanometer difference in the formation of structures therein. The spatially tunable heaters 140 improve the temperature profile of the surface of the substrate 134 produced by the main resistive heaters 154 by reducing variations in the temperature profile to about +/−0.3 degrees Celsius. The temperature profile may be made uniform or to vary precisely in a predetermined manner across regions of the substrate 134 through the use of the spatially tunable heaters 140 to obtain desired results.

Figure 2:
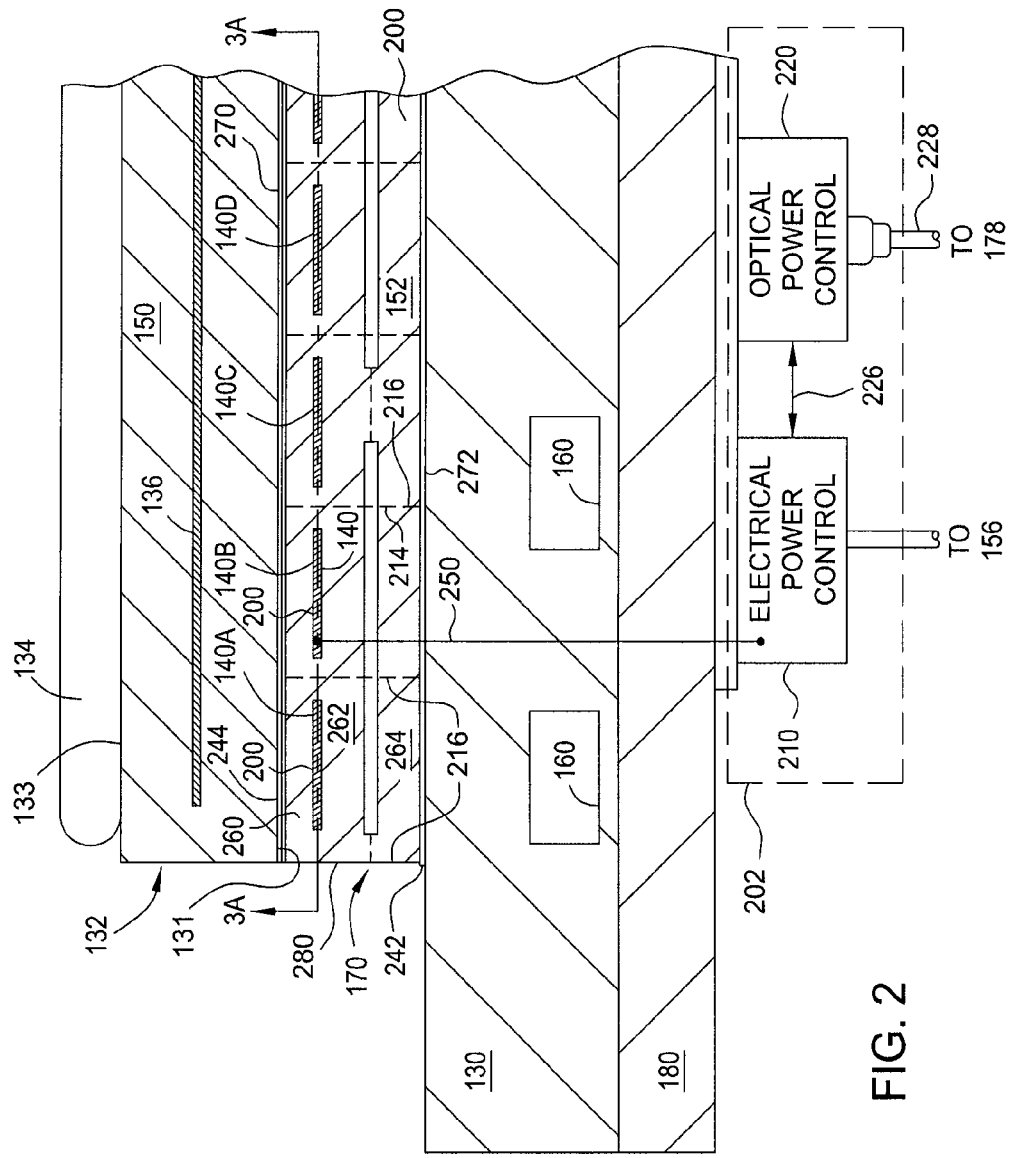
FIG. 2 is a partial cross-sectional schematic side view detailing portions of the substrate support assembly.

FIG. 2 is a partial cross-sectional schematic view illustrating portions of the substrate support assembly 126. Included in FIG. 2 are portions of the electrostatic chuck 132, the cooling base 130, heater assembly 170 and the facility plate 180.

The body 152 of the heater assembly 170 may be fabricated from a polymer such as a polyimide. The body 152 may generally be cylindrical in plan form, but may also be formed in other geometrical shapes. The body 152 has an upper surface 270 and a lower surface 272. The upper surface 270 faces the electrostatic chuck 132, while the lower surface 272 faces the cooling base 130.

The body 152 of the heater assembly 170 may be formed from two or more dielectric layers (shown in FIG. 2 as three dielectric layers 260, 262, 264) and heating the layers 260, 262, 264 under pressure to form a single body 152. For example, the body 152 may be formed from polyimide layers 260, 262, 264, which separate the main and spatially tunable heaters 154, 140, which are heated under pressure to form the single body 152 of the heater assembly 170. The spatially tunable heaters 140 may be placed in, on or between the first, second or third layers 260, 262, 264 prior to forming the body 152. Additionally, the main resistive heaters 154 may be placed in, on or between the first, second or third layers 260, 262, 264 prior to assembly, with at least one of the layers 260, 262, 264 separating and electrically insulating the heaters 154, 140. In this manner, the spatially tunable heaters 140 and the main resistive heaters 154 become an integral part of the heater assembly 170.

Alternate configurations for locations of the main resistive heaters 154 and the spatially tunable heaters 140 may place one or both heaters 154, 140 in or under the electrostatic chuck 132. FIGS. 3A-3E are partial schematic views of the substrate support assembly 126 detailing various locations for the spatially tunable heaters 140 and the main resistive heaters 154, although not limiting to all embodiments.

Figure 3C:
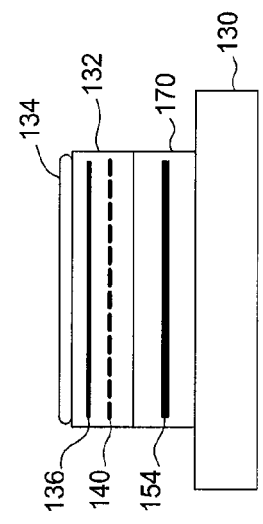
FIG. 3A-3E are partial schematic side views of illustrating various locations for spatially tunable heaters and main resistive heaters within the substrate support assembly.
Figure 3E:
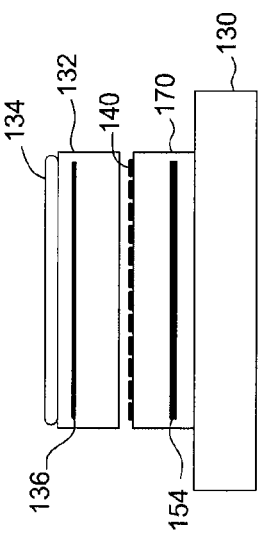
Figure 3A:
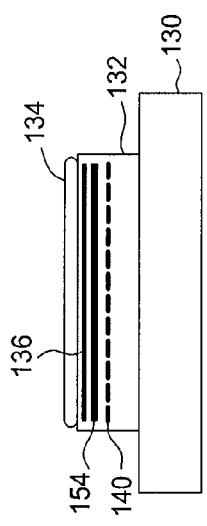
Figure 3B:
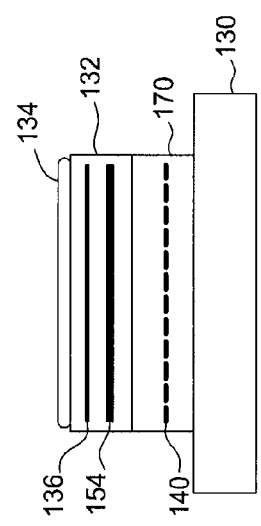

In the embodiment depicted in FIG. 3A, the substrate support assembly 126 does not have a heater assembly (170) and the spatially tunable heaters 140 and the main resistive heaters 154 are disposed in the electrostatic chuck 132, for example, below the chucking electrode 136. Although the spatially tunable heaters 140 are shown below the main resistive heaters 154, the spatially tunable heaters 140 may be alternatively positioned above the main resistive heaters 154. In the embodiment depicted in FIG. 3B, the heater assembly 170 for the substrate support assembly 126 includes the spatially tunable heaters 140 while the main resistive heaters 154 are disposed in the electrostatic chuck 132, for example, below the chucking electrode 136. Alternatively, the spatially tunable heaters 140 may be disposed in the electrostatic chuck 132 while the main resistive heaters 154 are disposed in the heater assembly 170. In the embodiment depicted in FIG. 3C, the heater assembly 170 for the substrate support assembly 126 has the main resistive heaters 154 disposed therein. The spatially tunable heaters 140 are disposed in the electrostatic chuck 132, for example, below the chucking electrode 136. In the embodiment depicted in FIG. 3D, the heater assembly 170 for the substrate support assembly 126 has spatially tunable heaters 140 disposed therein while the main resistive heaters 154 are disposed on one of the heater assembly 170 or the electrostatic chuck 132. The heater assembly 170 isolates the spatially tunable heaters 140 from the cooling base 130. In the embodiment depicted in FIG. 3E, the heater assembly 170 of the substrate support assembly 126 has main resistive heaters 154 disposed therein. The spatially tunable heaters 140 are disposed in or on the heater assembly 170, for example, below the electrostatic chuck 132. It is contemplated that the spatially tunable heaters 140 and the main resistive heaters 154 may be arranged in other orientations. For example, the substrate support assembly 126 may only have the plurality of spatially tunable heaters 140 for heating the substrate 134. In one embodiment, the spatially tunable heaters 140 and the main resistive heaters 154 are disposed directly under each other within substrate support assembly 126. The spatially tunable heaters 140 provide fine tune control for the temperature profile of the substrate 134 supported by the substrate support assembly 126.

Returning back to FIG. 2, the spatially tunable heaters 140 may be formed or disposed on or in the body 152 of the heater assembly 170 or electrostatic chuck 132. The spatially tunable heaters 140 may be formed by plating, ink jet printing, screen printing, physical vapor deposition, stamping, wire mesh, pattern polyimide flex circuit, or by other suitable manner. Vias may be formed in the heater assembly 170 or electrostatic chuck 132 for providing connections from the spatially tunable heaters 140 to an exterior surface of the heater assembly 170 or electrostatic chuck 132. For example, the body 150 of the electrostatic chuck 132 has vias formed therein between the spatially tunable heaters 140 and the mounting surface 131 of the body 150. Alternately, the body 152 of the heater assembly 170 has vias formed therein between the spatially tunable heaters 140 and a surface of the body 152 adjacent the cooling base 130. In this manner fabrication of the substrate support assembly 126 is simplified. In one embodiment, the spatially tunable heaters 140 are disposed within the heater assembly 170 while forming the heater assembly 170. In another embodiment, the spatially tunable heaters 140 are directly disposed on the mounting surface 131 of the electrostatic chuck 132. For example, the spatially tunable heaters 140 may be in a sheet form which can be adhered to the mounting surface 131 of the electrostatic chuck 132, or the spatially tunable heaters may be deposited by other means. For example, the spatially tunable heaters 140 can be deposited on the mounting surface 131 by physical vapor deposition, chemical vapor deposition, screen printing or other suitable methods. The main resistive heaters 154 can be in the electrostatic chuck 132 or heater assembly 170 as shown above.

The main resistive heaters 154 may be formed or disposed on or in the body 152 of the heater assembly 170 or electrostatic chuck 132. The main resistive heaters 154 may be formed by plating, ink jet printing, screen printing, physical vapor deposition, stamping, wire mesh or other suitable manner. In this manner fabrication of the substrate support assembly 126 is simplified. In one embodiment, main resistive heaters 154 are disposed within the heater assembly 170 while forming the heater assembly 170. In another embodiment, main resistive heaters 154 are directly disposed on the mounting surface 131 of the electrostatic chuck 132. For example, main resistive heaters 154 may be in a sheet form which can be adhered to the mounting surface 131 of the electrostatic chuck 132, or main resistive heaters 154 may be deposited by other means. For example, main resistive heaters 154 can be deposited on the mounting surface 131 by physical vapor deposition, chemical vapor deposition, screen printing or other suitable methods. The spatially tunable heaters 140 can be in the electrostatic chuck 132 or heater assembly 170 as shown above.

In some embodiments, the main resistive heaters 154 may be fabricated similar to the spatially tunable heaters 140, and in such embodiments, may optionally be utilized without benefit of additional spatially tunable heaters 140. In other words, the main resistive heaters 154 of the substrate support assembly 126 may themselves be spatially tunable, that is, segmented in to a plurality of discreet resistive heating elements. Segmenting the main resistive heaters 154 in the form of small resistive heaters allows local control of hot and cold spots on the surface of the substrate 134. An additional layer of spatially tunable heaters 140 is optional, depending on the desired level of temperature control.

The heater assembly 170 may be coupled to the mounting surface 131 of the electrostatic chuck 132 utilizing a bonding agent 244. The bonding agent 244 may be an adhesive, such as an acrylic-based adhesive, an epoxy, a silicon based adhesive, a neoprene-based adhesive or other suitable adhesive. In one embodiment, the bonding agent 244 is an epoxy. The bonding agent 244 may have a coefficient of thermal conductivity selected in a range from 0.01 to 200 W/mK and, in one exemplary embodiment, in a range from 0.1 to 10 W/mK. The adhesive materials comprising the bonding agent 244 may additionally include at least one thermally conductive ceramic filler, e.g., aluminum oxide ($Al_2O_3$), aluminum nitride (AlN), and titanium diboride ($TiB_2$), and the like.

In one embodiment, the heater assembly 170 is coupled to the cooling base 130 utilizing a bonding agent 242. The bonding agent 242 may be similar to the bonding agent 244 and may be an adhesive, such as an acrylic-based adhesive, an epoxy, a neoprene-based adhesive or other suitable adhesive. In one embodiment, the bonding agent 242 is an epoxy. The bonding agent 242 may have a coefficient of thermal conductivity selected in a range from 0.01 to 200 W/mK and, in one exemplary embodiment, in a range from 0.1 to 10 W/mK. The adhesive materials comprising the bonding agent 242 may additionally include at least one thermally conductive ceramic filler, e.g., aluminum oxide ($Al_2O_3$), aluminum nitride (AlN), and titanium diboride ($TiB_2$), and the like.

The bonding agents 244, 242 may be removed when refurbishing one or both of the electrostatic chuck 132, the cooling base 130 and the heater assembly 170. In other embodiments, the heater assembly 170 is removably coupled to the electrostatic chuck 132 and to the cooling base 130 utilizing fasteners or clamps (not shown).

The heater assembly 170 includes a plurality of spatially tunable heaters 140, illustratively shown as spatially tunable heaters 140a, 140b, 140c. The spatially tunable heaters 140 are generally an enclosed volume within the heater assembly 170 in which a plurality of resistive heaters effectuate heat transfer between the heater assembly 170 and electrostatic chuck 132. Each spatially tunable heater 140 may be laterally arranged across the heater assembly 170 and thus defined a cell 200 within the heater assembly 170 for locally providing additional heat to region of the heater assembly 170 (and portion of the main resistive heater 154) aligned that cell 200. The number of spatially tunable heaters 140 formed in the heater assembly 170 may vary, and it is contemplated that there is at least an order of magnitude more spatially tunable heaters 140 (and cells 200) greater than the number of the main resistive heaters 154. In one embodiment in which the heater assembly 170 has four main resistive heaters 154, there may be greater than 40 spatially tunable heaters 140. However, it is contemplated that there may be about 200, about 400 or even more spatially tunable heaters 140 in a given embodiment of a substrate support assembly 126 configured for use with a 300 mm substrate. Exemplary distribution of the spatially tunable heaters 140 are described further below with reference to FIGS. 4A-4D.

The cells 200 may be formed through one or more layers 260, 262, 264 comprising the body 152 of the heater assembly 170. In one embodiment, the cells are open to the lower and upper surface 272, 272 of the body 152. The cells may include sidewalls 214. The sidewalls 214 may be comprised of a material (or gap) acting as a thermal choke 216. The thermal chokes 216 are formed in the upper surface 270 of the body 152. The thermal chokes 216 separate and reduce conduction between adjacent cells 200. Thus, by individually and independently controlling the power provided to each spatially tunable heaters 140, and consequently the heat transfer through cell 200, a pixel by pixel approach to temperature control can be realized which enables specific points of the substrate 134 to be heated or cooled, thereby enabling a truly addressable lateral temperature profile tuning and control of the surface of the substrate 134.

An additional thermal choke 216 may be formed between the radially outermost cells 200 and a laterally outermost sidewall 280 of the body 152. This outermost thermal choke 216 located between the cells 200 and the laterally outermost sidewall 280 of the body 152 minimizes heat transfer between the cells 200, adjacent to the laterally outermost sidewall 280, and the internal volume 124 of the processing chamber 100. Thereby allowing more precise temperature control closer to the edge of the substrate support assembly 126, and as a result, better temperature control to the outside diameter edge of the substrate 134.

Each spatially tunable heater 140 may be independently coupled to the tuning heater controller 202. The tuning heater controller 202 may be disposed in the substrate support assembly 126. The tuning heater controller 202 may regulate the temperature of the spatially tunable heaters 140 in the heater assembly 170 at each cell 200 relative to the other cells 200, or alternatively, regulate the temperature of a group of spatially tunable heaters 140 in the heater assembly 170 across a group of cells 200 relative to the another group of cells 200. The tuning heater controller 202 may toggle the on/off state or control the duty cycle for individual spatially tunable heaters 140. Alternately, the tuning heater controller 202 may control the amount of power delivered to the individual spatially tunable heaters 140. For example, the tuning heater controller 202 may provide one or more spatially tunable heaters 140 ten watts of power, other spatially tunable heaters 140 nine watts of power, and still other spatially tunable heaters 140 one watt of power.

In one embodiment, each cell 200 may be thermally isolated from the neighboring cells 200, for example, using a thermal choke 216, which enables more precise temperature control. In another embodiment, each cell 200 may be thermally joined to an adjacent cell creating an analogue (i.e., smooth or blended) temperature profile along an upper surface 270 of the heater assembly 170. For example, a metal layer, such as aluminum foil, may be used as a thermal spreader between the main resistive heaters 154 and the spatially tunable heaters 140.

The use of independently controllable spatially tunable heaters 140 to smooth out or correct the temperature profile generated by the main resistive heaters 154 enable control of the local temperature uniformity across the substrate to very small tolerances, thereby enabling precise process and CD control when processing the substrate 134. Additionally, the small size and high density of the spatially tunable heaters 140 relative to the main resistive heaters 154 enables temperature control at specific locations on the substrate support assembly 126, substantially without affecting the temperature of neighboring areas, thereby allowing local hot and cool spots to be compensated for without introducing skewing or other temperature asymmetries. The substrate support assembly 126, having a plurality of spatially tunable heaters 140, has demonstrated the ability to control the temperature uniformity of a substrate 134 processed thereon to less than about ±0.3 degrees Celsius.

Another benefit of some embodiments of the substrate support assembly 126 is the ability to prevent RF power from traveling through control circuitry. For example, the tuning heater controller 202 may include an electrical power circuit 210 and an optical controller 220. The electrical power circuit 210 is coupled to the spatially tunable heaters 140. Each spatially tunable heater 140 has a pair of power leads (connectors 250) which are connected to the electrical power circuit 210. In an exemplary heater assembly 170 having fifty spatially tunable heaters 140, 60 hot and 1 common power lead (connectors 250) are needed for controlling the spatially tunable heaters 140. The RF energy supplied into the processing chamber 100 for forming the plasma couples to the power leads. Filters, such as the RF filters 182, 184, 186 shown in FIG. 1, are used to protect electrical equipment, such as the main heater power source 156, from the RF energy. By terminating the power leads (connectors 250) at the electrical power circuit 210, and utilizing the optical controller 220 to each spatially tunable heater 140, only the single RF filter 184 is needed between the electrical power circuit 210 and the power source 156. Instead of each heater having a dedicated RF Filter, the spatially tunable heaters are able to use one RF filter which significantly reduces the number of RF filters required. The space for dedicated RF filters is very limited, and the number of heaters utilized within the substrate support assembly is also limited. Therefore, the number of main heater zones is not limited and implementing spatially tunable heaters becomes possible. Thus, the use of the electrical power circuit 210 with the optical controller 220 allow more heaters, and consequently, superior lateral temperature control.

The electrical power circuit 210 may switch or cycle power to the plurality of connectors 250. The electrical power circuit 210 provides power to each of the connectors 250 to activate one or more spatially tunable heaters 140. Although the electrical power source ultimately supplies power to the plurality of spatially tunable heaters 140, the electrical power circuit 210 has a single power source, i.e. the tuning heater power source 142, and thus only requires only the single filter 184. Advantageously, the space and expense for additionally filters are mitigated, while enabling use of many heaters and heater zones.

The optical controller 220 may be coupled to the electrical power circuit 210 by a fiber optic interface 226, such as a fiber optic cable, to control the power supplied to the connectors 250 and thus, the spatially tunable heaters 140. The optical controller 220 may be coupled to the optical converter 178 through an optical wave guide 228. The optical converter 178 is coupled to the controller 148 for providing signals controlling the function of the spatially tunable heaters 140. The fiber optic interface 226 and optical wave guide 228 are not subject to electromagnetic interference or radio frequency (RF) energy. Thus, an RF filter to protect the controller 148 from RF energy transmission from the tuning heater controller 202 is unnecessary, thereby allowing more space in the substrate support assembly 126 for routing other utilities.

The optical controller 220 may send commands, or instruction, to the electrical power circuit 210 for regulating each spatially tunable heater 140 or groups/regions of spatially tunable heaters 140. Each spatially tunable heater 140 may be activated using a combination of a positive lead and a negative lead, i.e., the connectors 250, attached to the electrical power circuit 210. Power may flow from electrical power circuit 210 over the positive lead to the spatially tunable heater 140 and return over the negative lead back to the electrical power circuit 210. In one embodiment, the negative leads are shared amongst the spatially tunable heaters 140. Thus, the spatially tunable heaters 140 would each have an individual dedicated positive lead while sharing a common negative lead. In this arrangement, the number of connectors 250 from the electrical power circuit 210 to the plurality of spatially tunable heaters 140 is one more than the number of spatially tunable heaters 140. For example, if the substrate support assembly 126 has one hundred (100) spatially tunable heaters 140, there would be 100 positive leads and 1 negative lead for a total of 101 connectors 250 between the spatially tunable heaters 140 and the electrical power circuit 210. In another embodiment, each spatially tunable heater 140 has a separate negative lead connecting the spatially tunable heater 140 to the electrical power circuit 210. In this arrangement, the number of connectors 250 from the electrical power circuit 210 to the spatially tunable heaters 140 is twice the number of spatially tunable heaters 140. For example, if the substrate support assembly 126 has one hundred (100) spatially tunable heaters 140, there would be 100 positive leads and 100 negative leads for a total of 200 connectors 250 between the spatially tunable heaters 140 and the electrical power circuit 210.

The optical controller 220 may be programmed and calibrated by measuring the temperature at each spatially tunable heater 140. The optical controller 220 may control the temperature by adjusting the power parameters for individual spatially tunable heaters 140. In one embodiment, the temperature may be regulated with incremental power increases to the spatially tunable heaters 140. For example, a temperature rise may be obtained with a percentage increase, for example 9% increase, in the power supplied to the spatially tunable heater 140. In another embodiment, the temperature may be regulated by cycling the spatially tunable heater 140 on and off. In yet another embodiment, the temperature may be regulated by a combination of cycling and incrementally adjusting the power to each spatially tunable heater 140. A temperature map may be obtained using this method. The map may correlate the CD or temperature to the power distribution curve for each spatially tunable heater 140. Thus, the spatially tunable heater 140 may be used to generate a temperature profile on the substrate based on a program regulating power settings for the individual spatially tunable heaters 140. The logic can be placed directly in the optical controller 220 or in an externally connected controller, such as the controller 148.

Figure 3D:
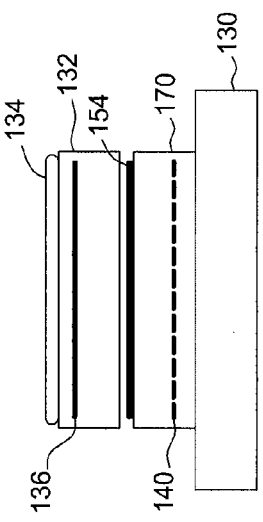
Figure 4A:
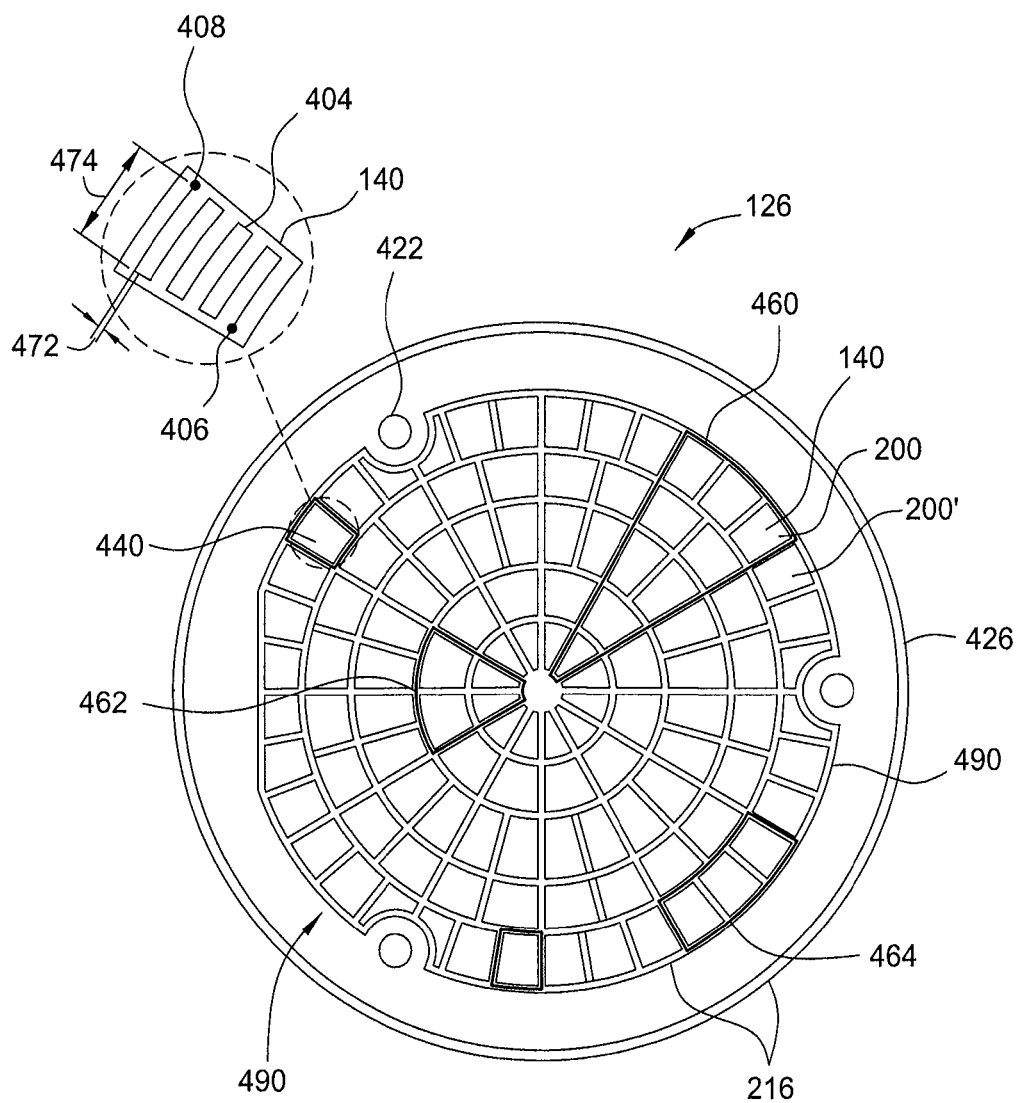
FIG. 4A is a cross-sectional view taken along a section line A-A of FIG. 2.
Figure 4B:
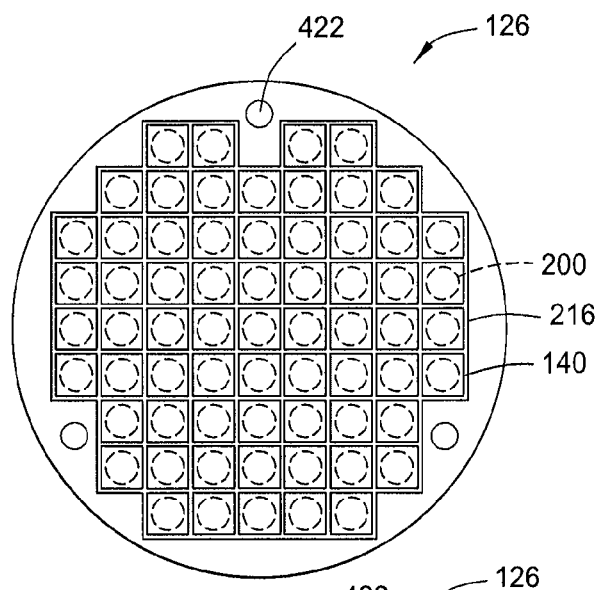
FIGS. 4B-4D are cross-sectional views taken along the section line A-A of FIG. 2, illustrating alternative layouts for spatially tunable heaters.

The arrangement of the spatially tunable heaters 140 will now be discussed with reference to FIGS. 4A through 4D. FIG. 4A is a cross-sectional view of FIG. 2 along a section line A-A, according to one embodiment. FIGS. 4B-3D are cross-sectional views along the same section line A-A of FIG. 2, according to alternate embodiments.

Referring now to FIG. 4A, the plurality of spatially tunable heaters 140 are disposed along the plane of the cross section line A-A through the body 152 of the heater assembly 170. The thermal choke 216 is disposed between each neighboring cell 200, each cell 200 associated with at least one of the of spatially tunable heaters 140. Additionally, the thermal choke 216 is disposed along an outer surface 426 of the substrate support assembly 126. The number of cells 200 shown is for illustration only, and any number of embodiments may have substantially more (or less) cells 200. The number of spatially tunable heaters 140 may be at least an order of magnitude greater than the number of main resistive heaters 154. The number of spatially tunable heaters 140 located across the substrate support assembly 126 may easily be in excess of several hundred.

Each spatially tunable heater 140 has a resistor 404 ending in terminals 406, 408. As current enters one terminal, such as the terminal labeled 406, and exists the other terminal, such as the terminal labeled 408, the current travels across the wire of the resistor 404 and generates heat. The spatially tunable heater 140 may have a design power density to provide the appropriate temperature rise along the outer surface 426 of the substrate support assembly 126. The amount of heat released by the resistor 404 is proportional to the square of the current passing therethrough. The power design density may be between about 1 watt/cell to about 100 watt/cell, such as 10 watt/cell.

The resistor 404 may be formed from a film of nichrome, rhenium, tungsten, platinum, tantalum or other suitable materials. The resistor 404 may have an electrical resistivity ($\rho$). A low $\rho$ indicates a material that readily allows the movement of an electric charge across the resistor 404. The resistance (R) is dependent on the $\rho$ times the length (l) over the cross sectional area (A) of the wire, or simply $R=\rho \cdot l/A$. Platinum has a $\rho$ of about $1.06 \times 10^{-7}$ ($\Omega \cdot m$) at 20° C. Tungsten has a $\rho$ of about $6.60 \times 10^{-8}$ ($\Omega \cdot m$) at 20° C. Nichrome has a $\rho$ of about $1.1 \times 10^{-8}$ to about $1.5 \times 10^{-8}$ ($\Omega \cdot m$) at 20° C. Of the three aforementioned materials, the resistor 404 comprised of nichrome allows the electrical charge to move more readily, and thus, generate more heat. However, the electrical properties for tungsten may differentiate the material as a resistive heater in certain temperature ranges.

The resistor 404 may have a film thickness (not shown) and a wire thickness 472 configured to efficiently provide heat when a current is passed along the resistor 404. An increase in the wire thickness 472 for the resistor 404 may result in a decrease in the resistance R of the resistor 404. The wire thickness 472 may range from about 0.05 mm to about 0.5 mm for a tungsten wire and about 0.5 mm to about 1 mm for a nichrome wire.

Recalling the formula $R=\rho \cdot l/A$, it can be seen that the material, length of wire, and the wire thickness may be selected for the resistor 404 to control cost, power consumption, and the heat generated by each spatially tunable heater 140. In one embodiment, a resistor 404 is comprised of tungsten having a wire thickness 472 of about 0.08 mm and a resistance of about 90 Ohms at 10 watts of power.

The spatially tunable heaters 140 may be configured in a pattern 490 to efficiently generate a heat profile along the surface of the substrate support assembly 126. The pattern 490 may be symmetric about a midpoint 492 while providing clearance in and around holes 422 for lift pins or other mechanical, fluid or electrical connections. Each spatially tunable heater 140 may be controlled by the tuning heater controller 202. The tuning heater controller 202 may turn on a single spatially tunable heater 140 defining a heater 440; or a plurality of spatially tunable heaters 140 grouped to define an inner wedge 462, a perimeter group 464, a pie shaped area 460, or other desired geometric configuration, including non-contiguous configurations. In this manner, temperature can be precisely controlled at independent locations along the surface of the substrate support assembly 126, such independent locations not limited to concentric ring such as known in the art. Although the pattern shown is comprised of smaller units, the pattern may alternatively have larger and/or smaller units, extend to the edge, or have other forms.

FIG. 4B is a top view of the plurality of spatially tunable heaters 140 disposed along the plane of the cross section line AA through the body 152, according to another embodiment. The thermal chokes 216 may optionally be present. The spatially tunable heaters 140 are arranged in the form of a grid, thus defining an array of temperature control cells 200 also arranged in the grid pattern. Although the grid pattern of spatially tunable heaters 140 is shown as an X/Y grid comprised of rows and columns, the grid pattern of spatially tunable heaters 140 may alternatively have some other uniformly packed form, such as a hexagon close pack. It should be appreciated, as discussed supra, the spatially tunable heaters 140 may be activated in groups or singularly.

Figure 4C:
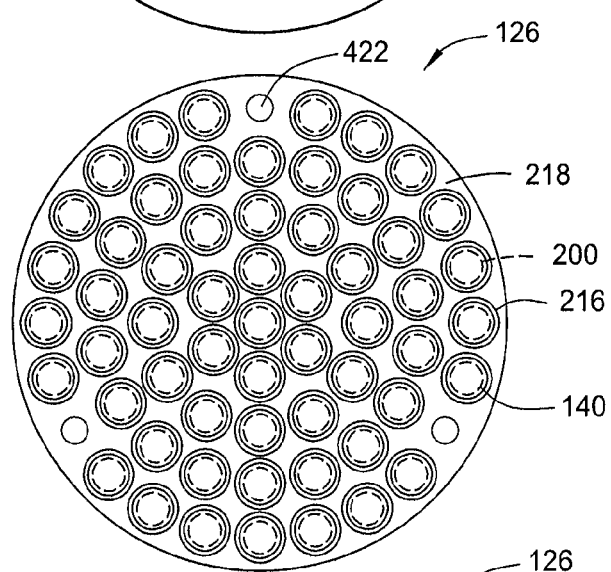

FIG. 4C is a top view of the plurality of spatially tunable heaters 140 disposed along the plane of the cross section line AA through the body 152, according to another embodiment. FIG. 4C illustrates a plurality of spatially tunable heaters 140 arranged in a polar array in the body 152. Optionally, one or more of thermal chokes 216 may be disposed between the spatially tunable heaters 140. The polar array pattern of the spatially tunable heaters 140 defines the neighboring cells 200, which are thus also be arranged in a polar array. Optionally, thermal chokes 216 may be utilized to isolate adjacent cells 200 from neighboring cells 200.

Figure 4D:
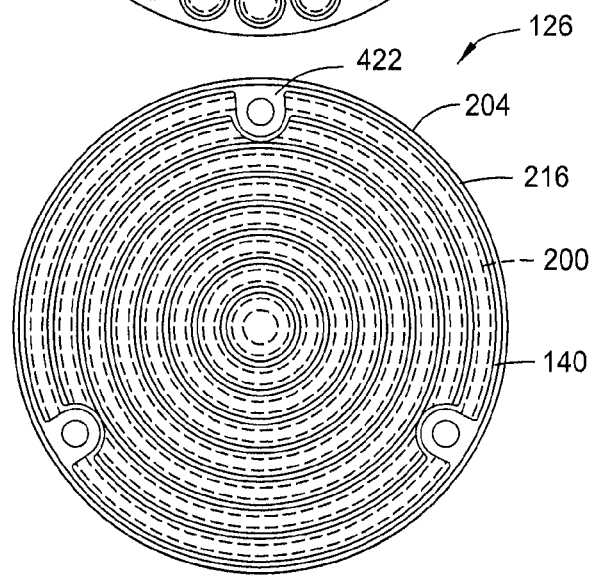

FIG. 4D is a top view of the plurality of spatially tunable heaters 140 disposed along the plane of the cross section line A-A through the body 152, according to another embodiment. FIG. 4D illustrates a plurality of spatially tunable heaters 140 arranged in the body 152 in concentric channels. The concentric channel pattern of the spatially tunable heaters 140 may be optionally separated by thermal chokes 216. It is contemplated that the spatially tunable heaters 140 and cells 200 may be arranged in other orientations.

The number and density of the spatially tunable heaters 140 contribute to the ability for controlling the temperature uniformity across the substrate to very small tolerances which enables precise process and CD control when processing the substrate 134. Additionally, individual control of one spatially tunable heaters 140 relative to another spatially tunable heaters 140 enables temperature control at specific locations in the substrate support assembly 126 without substantially affecting the temperature of neighboring areas, thereby allowing local hot and cool spots to be compensated for without introducing skewing or other temperature asymmetries. The spatially tunable heaters 140 may have an individual temperature range between about 0.0 degrees Celsius and about 10.0 degrees Celsius with the ability to control the temperature rise in increments of about 0.1 degrees Celsius. In one embodiment, the plurality of spatially tunable heaters 140 in the substrate support assembly 126 in conjunction with the main resistive heaters 154 have demonstrated the ability to control the temperature uniformity of a substrate 134 processed thereon to less than about ±0.3 degrees Celsius. Thus, the spatially tunable heaters 140 allow both lateral and azimuthal tuning of the lateral temperature profile of the substrate 134 processed on the substrate support assembly 126.

Figure 5:
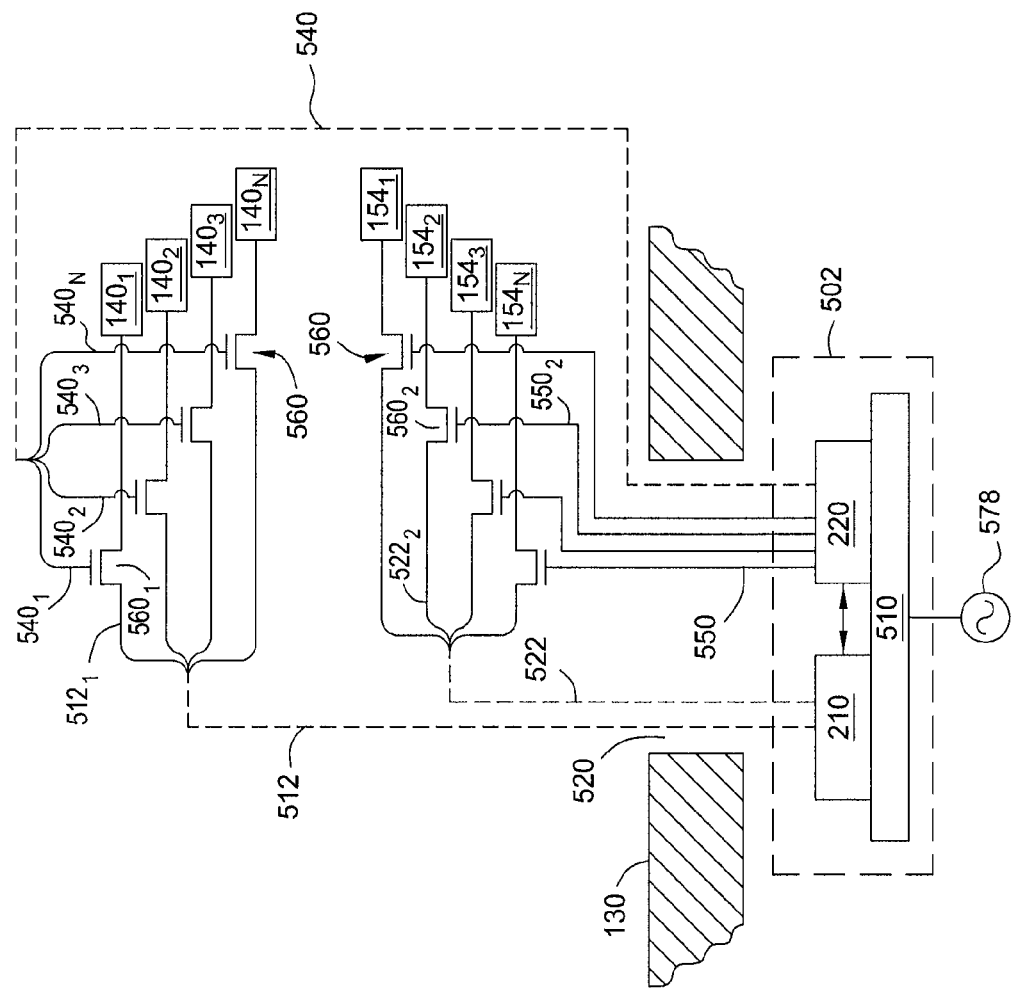
FIG. 5 is a graphical depiction for a wiring schema for the spatially tunable heaters and main resistive heaters.

Turning to FIG. 5, a graphical depiction is provided for a wiring schema for the main resistive heaters 154 and the spatially tunable heaters 140. The wiring schema provides for individual control, as opposed to multiplex control, over the spatially tunable heaters 140. The individual control provides any one spatially tunable heater 140, or selection of spatially tunable heaters 140, can be made active at the same time as any other spatially tunable heater 140, or selection of spatially tunable heaters 140. The wiring schema allows the independent control of an output to one of the plurality of spatially tunable heaters relative to another of the plurality of spatially tunable heaters. Thus, the spatially tunable heaters 140 do not have the power cycled between an on and an off state in order to allow power to other spatially tunable heater 140, or selection of spatially tunable heaters 140. This arrangement without cycling the power at the spatially tunable heaters advantageously allows a quick response time at the spatially tunable heaters 140 for achieving a desired temperature profile.

The main resistive heaters 154 and the spatially tunable heaters 140 may be attached to a control board 502. The control board 502 is attached to a power source 578 through a single RF filter 510. Since each heater 154, 140 shares the single RF filter 510 and does not have its own RF filter, space in the substrate support assembly 126 is conserved and additionally costs associated with the additional filters are advantageously mitigated. Control board 502 is similar to controller 202 shown in FIGS. 1 and 2, and has a similar version of the electrical controller 210 and the optical controller 220. The control board 502 may be internal or external to the substrate support assembly 126. In one embodiment the control board 502 is formed between the facility plate 180 and the cooling base 130.

The spatially tunable heaters $140_{(1-n)}$ are figuratively shown and should be understood that spatially tunable heater $140_1$ may represent a large group of spatially tunable heaters in a common zone, or alternatively, to all the spatially tunable heaters 140 disposed across the substrate support assembly 126. There are an order of magnitude more spatially tunable heaters 140 than main heaters 154, and therefore, an order of magnitude more connections to the electrical controller 210 and the optical controller 220.

The electrical controller 210 accepts a plurality of connectors 512 from the spatially tunable heaters 140 through one or more holes or slots 520 formed through the cooling base 130. The connectors 512 may contain a number of connections suitable for communicating between the spatially tunable heaters 140 and the electrical controller 210. The connectors 512 may be a cable, individual wires, a flat flexible cable such as a ribbon, a mating connector, or other suitable methods/means for transmitting signals between the spatially tunable heaters 140 and the electrical controller 210. In one embodiment, the connectors 512 are ribbon cables. The connectors 512 will be discussed using the term power ribbon 512.

The power ribbon 512 may be connected at one end to the spatially tunable heaters 140 in the ESC 132 and connect at the other end to the electrical controller 210. The power ribbon 512 may connect to the electrical controller via direct wiring, a socket, or suitable receptacle. In one embodiment, the electrical controller 210 has a socket configured for a high density of connections. The power ribbons 512 may use high density connectors to provide the large number of connections, such as 50 or more connections, from the spatially tunable heaters 140 to the electrical controller 210. The electrical controller 210 may have a high density interconnect (HDI) with a wiring density per unit area greater than conventional printed circuit boards. The HDI may interface with the high density connector of the power ribbon 512. The connector advantageously allows a high density of connections and easy assembly and disassembly of the substrate support assembly 126. For example, the ESC 132 may require maintenance, resurfacing or replacing and the connectors provide a quick and easy means of removing the ESC 132 for maintenance and quickly reconnecting the ESC 132 back to the substrate support assembly 126.

The electrical controller 210 may additionally accept a plurality of power ribbons 522 from the main resistive heaters 154 through the slot 520 formed through the cooling base 130. The power ribbons 512, 522, graphically depict a number of power leads for each spatially tunable heater 140 and main resistive heater 154. For example, power ribbon 512 includes a plurality of separate positive and negative power leads for each spatially tunable heater 140. Likewise, power ribbon 522 comprises separate positive and negative power leads for each main resistive heater 154. In one embodiment, each power lead has a switch 560 managed by the optical controller 220. The switch 560 may reside in the electrical controller 210, on the control board 502 or other suitable location. It is contemplated that a single ribbon, or even three or more equally spaced ribbons, may be utilized to route the power leads for the spatially tunable heaters 140 and main resistive heater 154. The equally spaced ribbons enhance field uniformity and thus uniformity of processing results.

The optical controller 220 is connected to an external controller (148 in FIG. 1) and is configured to provide instructions to the electrical controller for powering each spatially tunable heater 140. The optical controller 220 accepts a plurality of control ribbons 540 for managing the spatially tunable heaters 140. In one embodiment, the control ribbons 540 are imbedded in the control board 502 and connect the optical controller 220 to the electrical controller 210. For example, the control ribbons 540 may be circuitry connecting the two controllers 210, 220. In another embodiment, the control ribbon may attach the optical controller 220 to the electrical controller 210 via a cable or other suitable connection external to the control board 502. In yet another embodiment, the control ribbon 540 may pass through the slot 520 formed through the cooling base and manage each spatially tunable heater 140 individually.

The optical controller 220 may optionally accept a plurality of control ribbons 550 for managing the main resistive heaters 154. Alternatively, the main resistive heaters may be managed by a second optical controller or by an external controller. Similar to the control ribbon 540, control ribbon 550 may be imbedded in the control board 502 or attached to the main resistive heaters 154. Alternately, the main resistive heaters may not have a control ribbon 550 and the cycling and intensity of the power may be managed external at the power source 138.

The ribbons 540, 550 graphically depict a number of control leads for each spatially tunable heater 140 and main resistive heater 154. For example, control ribbon 540 comprises separate positive and negative control leads for a plurality of spatially tunable heaters 140. The optical controller 220 may take input, from a program, temperature measuring device, an external controller, a user or by other source, and determines which spatially tunable heaters 140 and/or main resistive heaters 154 to manage. As the optical controller 220 uses optics to communicate with other devices, such as the electrical controller 210, the optical controller is not subject to RF interference and does not propagate the RF signal to regions outside of the processing chamber. It is contemplated that a single ribbon, or even three or more ribbons, may be utilized to route the control leads.

The control ribbons 540 provide signals generated by the optical controller 220 to control the state of a switch 560. The switch 560 may be a field effect transistor, or other suitable electronic switch. Alternately, the switch 560 may be embedded in an optically controlled circuit board in the electrical controller 210. The switch 560 may provide simple cycling for the heaters 154, 140 between an energized (active) state and a de-energized (inactive) state.

The controller 202 may control at least one or more of the duty cycle, voltage, current, or duration of power applied to one or more selected spatially tunable heaters 140 relative another and at the same time. In one embodiment, the controller 202 provides a signal along the control ribbon $540_1$ to instruct the switch $560_1$ to allow 90% of the power to pass therethrough. The electrical controller 210 provides about 10 watts of power along the power ribbon $512_1$. The switch $560_1$ allows 90% of the supplied power to pass through to a spatially tunable heater $140_1$ which heats up with about 9 watts of power.

In another embodiment, the controller 202 provides a signal along the control ribbon $550_2$ to instruct the switch $560_2$ to allow 100 percent of the power to pass therethrough. The electrical controller 210 provides about 100 Watts of power along the power ribbon $522_2$. The switch $560_2$ allows 100 percent of the supplied power to pass through to the main resistive heater $154_2$ which heats up with about 100 Watts of power. Similarly, the main resistive heaters $154_{(1-N)}$ may all be operated from controller 202.

In yet another embodiment, the tuning heater controller 202 provides a signal along the control ribbon 540 to instruct the switches 560 to be in either an active state that allows power to pass therethrough or an inactive state that prevents power from passing therethrough. The electrical controller 210 provides about 10 Watts of power along the power ribbon 512 to each individual spatially tunable heater 140 coupled to a switch 560 in the active state. The tuning heater controller 202 independently controls at least one of the duration that the switch 560 remains in the active state and the duty cycle of each of the switch 560 relative to the other switches 560, which ultimately controls the temperature uniformity of the substrate support assembly 126 and substrate positioned thereon. The switches 560 controlling power to the main resistive heaters 154 may be similarly controlled.

In another embodiment, each main resistive heater $154_{(1-N)}$, representing a separate zone, may have a separate controller 202. In this embodiment, the spatially tunable heaters$_{(1-N)}$ common to a zone with one main resistive heater $154_{(1-N)}$ may share the controller 202 with the common main resistive heater $154_{(1-N)}$. For example, if there were four zones, there would be four main resistive heaters $154_{(1-4)}$ and four equally spaced controllers 202.

In other embodiments, separate controllers 202 may be utilized to split up the number of spatially tunable heaters 140 serviced by a single controller. For instance, each control ribbon 540 may have a separate optical controller 220 for managing a set number of spatially tunable heaters 140 individual. Splitting up the control of the spatially tunable heaters 140 allows for smaller controllers and less space required routing the ribbons through the slots 520 formed through the cooling base.

Figure 6:
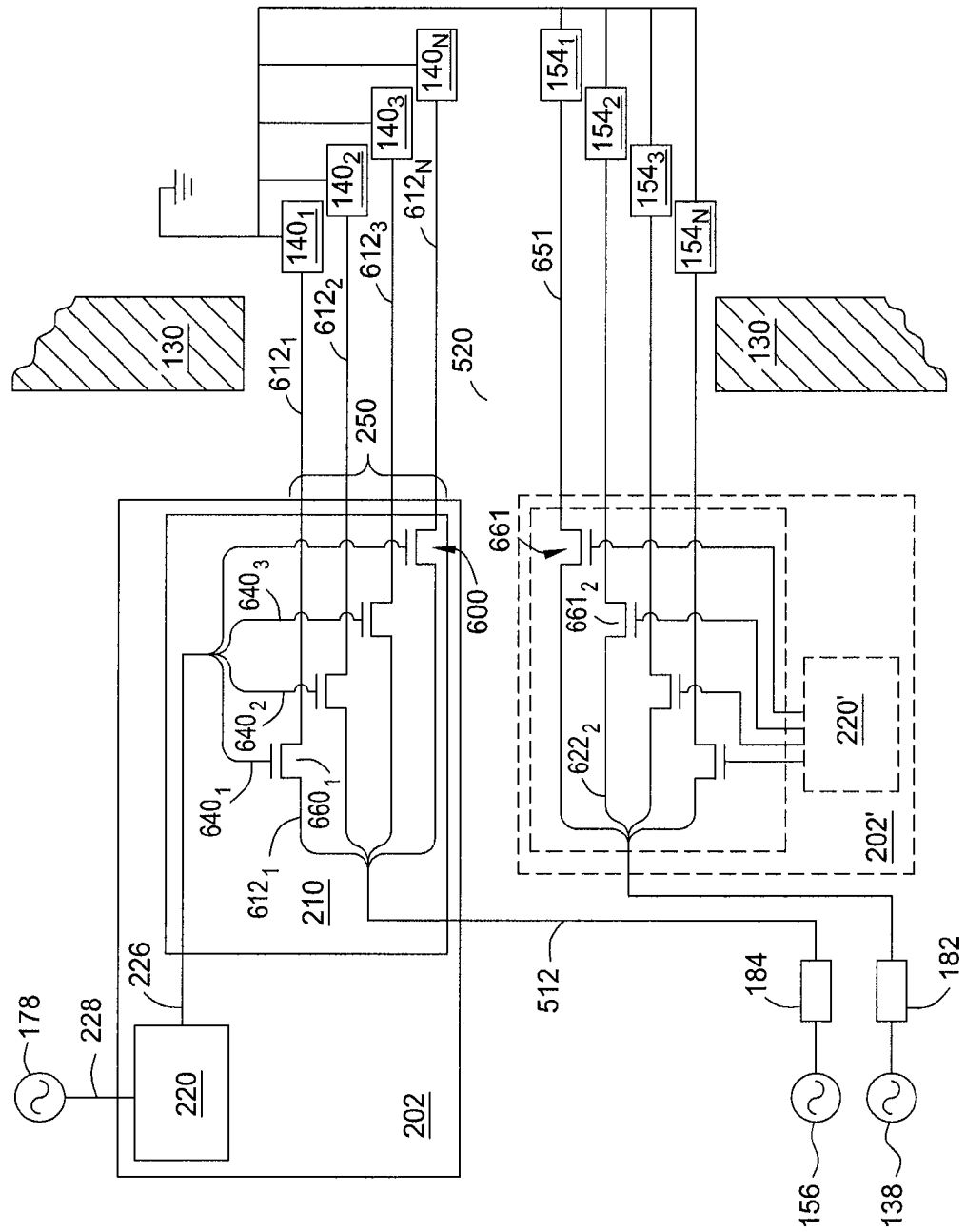
FIG. 6 is a graphical depiction for an alternate wiring schema for the spatially tunable heaters and main resistive heaters.

Turning to FIG. 6, a graphical depiction is provided for another wiring schema for the main resistive heaters 154 and the spatially tunable heaters 140. The wiring schema depicted in FIG. 6 provides for individual control of the spatially tunable heaters 140. The spatially tunable heaters 140 are attached to the tuning heater controller 202. The electrical controller 210 on the control board 502 is attached to the power source 156 through the filter 184. The optical controller 220 is connected to an external controller (148 in FIG. 1) and is configured to provide instructions to the electrical controller for powering each spatially tunable heater 140. The optical controller 220 communicates through the fiber optic interface 226 with the electrical controller 210 to manage the spatially tunable heaters 140. Similar to the wiring schema of FIG. 5, the wiring schema of FIG. 6 provides for independent control of an output of one of the plurality of spatially tunable heaters relative to the other spatially tunable heaters.

The main resistive heaters 154 may optionally be attached to a tuning heater controller 202', the tuning heater controller 202, or other controller external from the substrate support assembly 126. The tuning heater controller 202' may be substantially similar to the tuning heater controller 202. It should be appreciated that the control of the main resistive heaters 154 may be similar to that described for the spatially tunable heaters 140. Alternately, the main resistive heaters 154 may be managed externally as shown in FIG. 1.

The spatially tunable heaters $140_{(1-n)}$ are figuratively shown and should be understood that spatially tunable heater $140_1$ may represent a large group of spatially tunable heaters in a common zone, or alternatively, to all the spatially tunable heaters 140 disposed across the substrate support assembly 126. Each spatially tunable heater 140 has a connector 250 for transmitting power to the spatially tunable heater 140 from the electrical controller 210.

The electrical controller 210 accepts a plurality of power ribbons 612 from the spatially tunable heaters 140 through one or more holes or slots 520 formed through the cooling base 130. The ribbons 612 graphically depict a number of power leads for each spatially tunable heater 140. The power ribbon 612 provides an electrical pathway for power to the spatially tunable heaters 140. In one embodiment, the power ribbon 612 comprises separate positive power leads for each spatially tunable heater 140. The power ribbon 612 may optionally have a single negative power lead common to all the spatially tunable heaters 140 attached to the power ribbon 612. Alternately, the power ribbon 612 may have no negative power return path and the return path for the electrical current may be provided through a separate cable, a common bus, or other suitable means. In another embodiment, the power ribbon 612 comprises separate negative power leads for each spatially tunable heater 140. The power ribbon 612 may optionally have a single positive power lead common to all the spatially tunable heaters 140 attached to the power ribbon 612. Alternately, the power ribbon 612 may have no positive power supply path and the power supply path for the electrical current may be provided through a separate cable, a common bus, or other suitable means.

Figure 7:
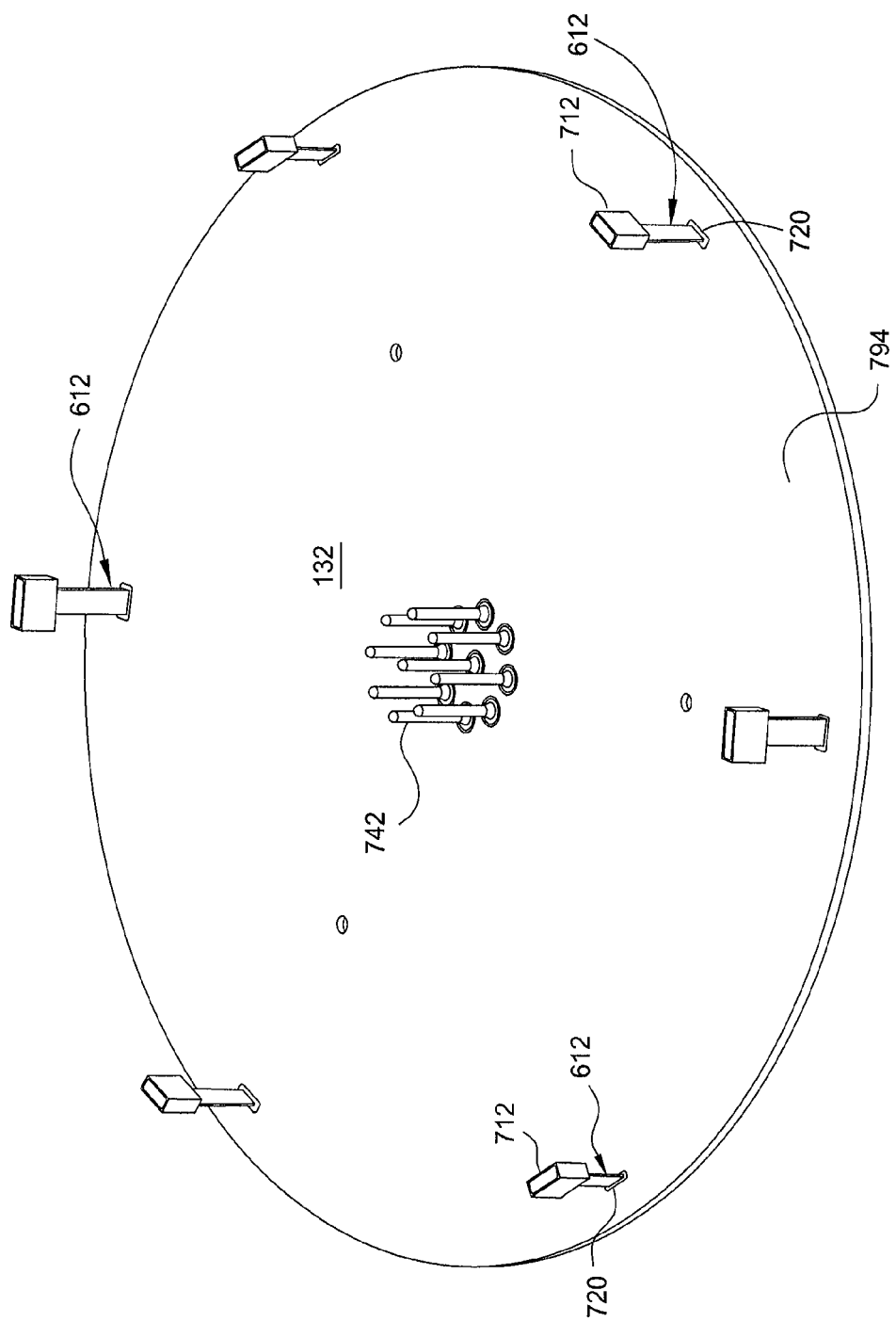
FIG. 7 is a bottom perspective view of the substrate support assembly, configured for the wiring schema depicted in FIG. 6.

Turing briefly to FIG. 7, FIG. 7 is a perspective view of a bottom 794 of the electrostatic chuck 132, configured for the wiring schema depicted in FIG. 6. The electrostatic chuck 132 may have a plurality of electrodes 742 for supplying a chucking force to a substrate deposed on the electrostatic chuck 132. Power ribbons 612 may be electrically attached to the bottom 794 of the electrostatic chuck 132 having the spatially tunable heaters 140 formed therein. The power ribbons 612 may be a flat flexible cable (FFC) or flexible printed circuit (FPC), such as a polyimide flat flexible cable, having a connector 712 at one end and contacts 720 at the other end. The connector 712 connects to the electrical controller 210. The connector 712 may be individual wires, a socket connector, a plug, a high density connector such as those used with flat flexible cables or flexible printed circuits, or other suitable connector. The contacts 720 may attach to the electrical connections formed in the electrostatic chuck 132, i.e. the vias. The contacts 720 may be soldered, glued or attached by other means to the electrostatic chuck 132. Alternately, the contacts 720 may be formed in direct connection to the spatially tunable heaters 140, such as wired power leads. The contacts 720 may have a combined area in contact with the electrostatic chuck 132 which is about less than a 0.75 inch diameter circle. This minimal area the contacts 720 have with the electrostatic chuck 132 reduces heat transfer from the electrostatic chuck 132 to the cooling base 130. The contacts 720 may be circular, rectangular, semi-circular or any other shape. The power ribbon 612 may have more than one contact 720 and thus a hundred or more leads. Thus, a single power ribbon 612 may be able to connect and individually control many spatially tunable heaters 140, depending on the wiring connection configuration to the electrical controller 210, such as sharing a common negative lead. In one embodiment, the electrostatic chuck 132 has six power ribbons 612 equally spaced and soldered thereon. The power ribbons 612 may each have twenty-five soldered contacts 720.

Figure 10:
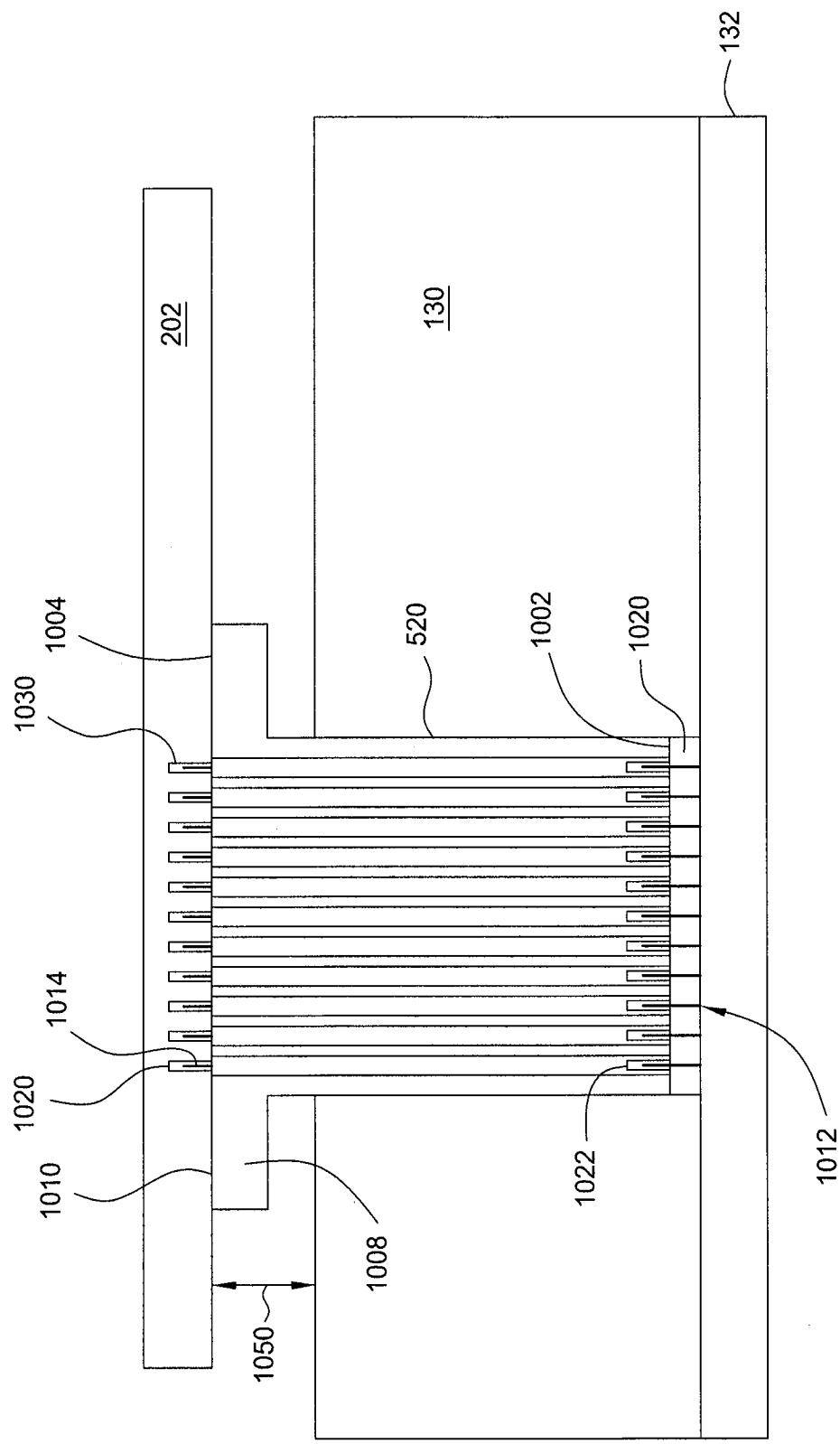
FIG. 10 is a cross-sectional view for a mating connector for connecting the electrostatic chuck to a controller.

Alternately, the power ribbons 612 may be replaced with a pin/receptacle connector. Turning briefly to FIG. 10, FIG. 10 illustrates a cross-sectional view for a mating connector 1010 connecting the ESC 132 to the tuning heater controller 202. The mating connector 1010 may be sized to pass through the slot 520 in the cooing base 130 to provide a connection between the tuning heater controller 202 and the ESC 132. The mating connector 1010 may have a flange 1008. The flange 1008 may be disposed between the cooling base 130 and the tuning heater controller 202. A gap 1050 may be formed between the cooling base 130 and the tuning heater controller 202. Alternately, the tuning heater controller 202 may have a cutout, notch, hole, void, or other opening which allows the mating connector 1010 to pass therethrough and substantially reduce the gap 1050 between the tuning heater controller 202 and the cooling base 130.

The mating connector 1010 may have a first end 1002 and a second end 1004. The first end 1002 may interface with the ESC 132. The second end 1004 may interface with the tuning heater controller 202. A plurality of contact pins 1012, 1014 interface with a plurality of pin receptacles 1020, 1022 to provide an electrical connection between the ESC 132 and the tuning heater controller 202. The pins 1012, 1014 may be about 0.3 mm or less. The pins 1012, 1014 have a corresponding plurality of pin receptacles 1020, 1022 configured to accept the pins 1012, 1014 and provide electrical continuity. The pins 1012, 1014 or pin receptacles 1020, 1022 may be formed on one or more of the first and second end 1002, 1004 of the mating connector 1010 and interface between the ESC 132 and the tuning heater controller 202.

The mating connector 1010 may provide a direct physical electrical connection between the tuning heater controller 202 and the ESC 132. For example, receptacles may be formed on the tuning heater controller 202 which accept pins 1014. Thus, cooling base 130 may be placed directly on the ESC 132, the mating connector 1010 inserted through the slot 520 in the cooling base 130, and the tuning heater controller 202 placed on mating connector 1010 to form a connection between the ESC 132 and the tuning heater controller 202. Alternately, the mating connector 1010 may utilize a cable, ribbon or flat connector to complete the connection between the tuning heater controller 202 and the ESC 132.

Advantageously, the mating connector 1010 may have a small cross-sectional area which correspondingly requires little open space in the cooling base 130 which minimizes the thermal conductance or disturbance of the cooling base 130 for better thermal uniformity. Additionally, the mating connector 1010 may protect the connections from the processing environment and extend the longevity for the electrical connections.

Returning back to FIG. 6, the electrical controller 210 may have a plurality of switches 660 formed therein. Each switch 660 may accept a positive power lead from one of the power ribbons 612 to control individual spatially tunable heaters 140. The optical controller 220 manages the switches 660 via a fiber optic interface 226 to the electrical controller 210. Circuitry 640 may be imbedded in the electrical controller 210 or the tuning heater controller 202 to convert the optical signal to an electrical signal for provided instructions to the switches 660.

The switches 660 may be a field effect transistor, or other suitable electronic switch. The switch 660 may provide simple cycling for the heaters 154, 140 between an energized (active) state and a de-energized (inactive) state. Alternately, the switch 660 may be another suitable device, which can control the amount of power supplied to the spatially tunable heaters 140.

The switches 660 may be formed internal to the substrate support assembly 126, such as in the electrostatic chuck 132, the cooling base 130, heater assembly 170 and the facility plate 180. Alternately, the switched 660 may be formed external to the substrate support assembly 126 or even the processing chamber 100, such as in the controller 148.

Figure 8:
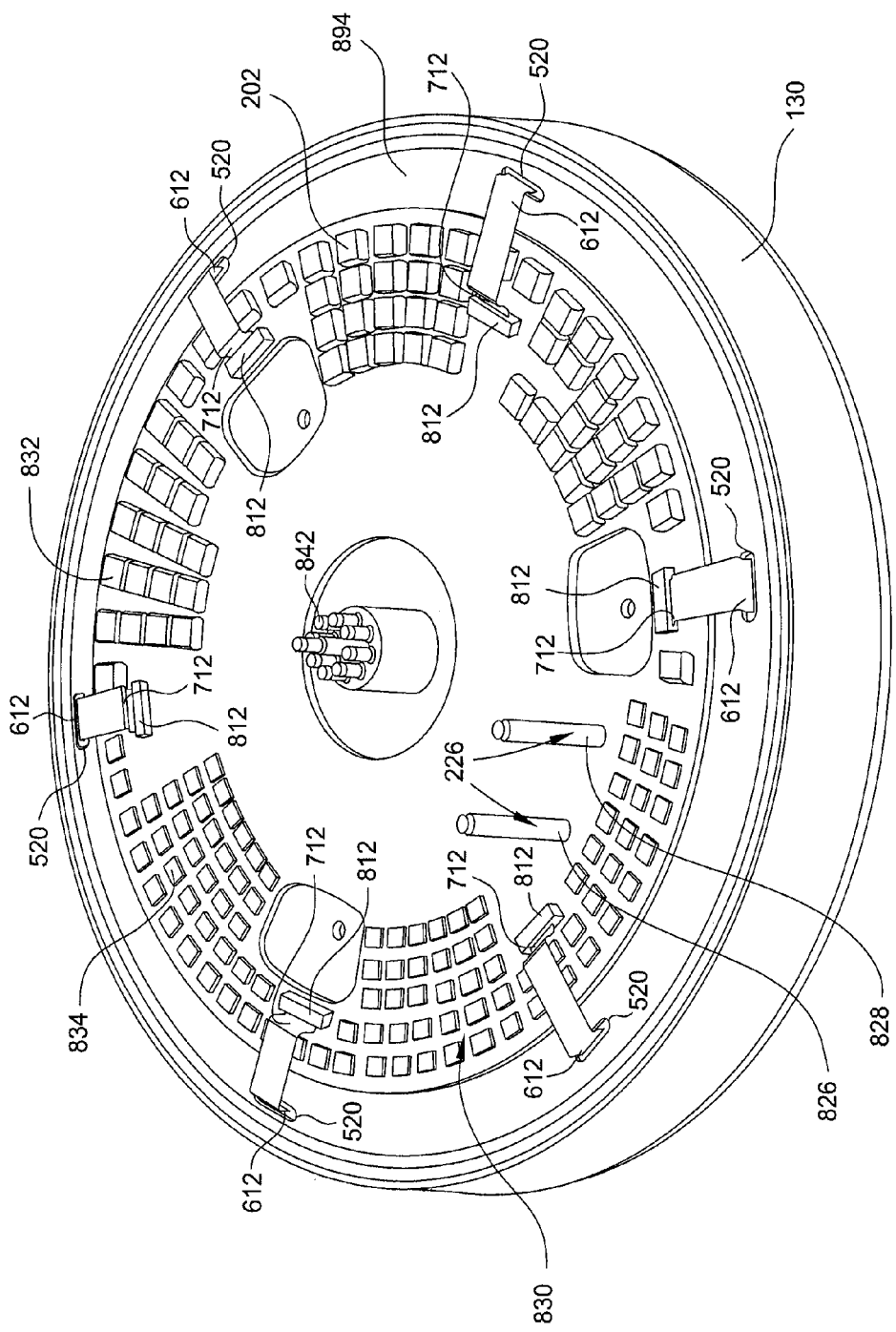
FIG. 8 is a bottom perspective view for the cooling base, configured for the wiring schema depicted in FIG. 6.

Turning to FIG. 8, FIG. 8 illustrates a bottom perspective view for the cooling base 130, configured for the wiring schema depicted in FIG. 6. The cooling base 130 may have a bottom surface 894, a plurality of cooling passages (not shown in FIG. 8), and passages 842. The cooling passages may be configured to circulate a cooling fluid therethrough to regulate the temperature of the electrostatic chuck 132. The passages 842 may be configured to allow the electrodes 742 supplying power to the electrostatic chuck 132 to pass through the cooling base 130. The passages 842 may be electrically insulated to provide protection from the electrodes 742 energizing the cooling base 130. Additionally, the cooling base may have one or more slots 520. The slots 520 may be configured to allow the ribbon 612 to pass from the electrostatic chuck 132 internally through the cooling base 130 to the bottom surface 894.

The electrical controller 210 may be disposed on the bottom surface 894 of the cooling base 130. The electrical controller 210 is mounted in an RF environment and thus communication with the electrical controller 210 may be performed via fiber optics while the power to the electrical controller 210 may be supplied through an RF filter. The electrical controller 210 may have a send 826 and a receive 828 fiber optic interface 226. The fiber optic interface 226 provides an optical connection to the optical controller 220. The fiber optic interface 226 is immune to RF and other electrical interference and therefore does not require a filter to protect connected devices/controller, such as the optical controller 220.

The tuning heater controller 202 may have a plurality of sockets 812. The sockets 812 may be configured to connect with the connectors 712 attached to the end of the ribbons 612. The sockets may provide fifty or more individual connections for each the ribbon 612. The electrical controller 210 may consist of a substrate 830 with a plurality of circuits 832, 834 formed thereon. The plurality of circuits 832, 834 may include transistors, resistors, capacitors and other electrical features for forming switches and controlling the flow of power to the individual connection in the sockets 812. The electrical controller 210 may therefore manage individual the spatially tunable heaters 140 by controlling at least one or more of the duty cycle, voltage, current, or duration of power applied over the individual connections in the sockets 812 attached to the ribbons 612.

In one embodiment, the switches 660 are formed on the electrical controller 210. Ribbons 612 with connectors 712 pass through the slots 520 in the cooling base 130 to connect the spatially tunable heaters 140 in the electrostatic chuck 132 to the electrical controller 210. The connectors 712 connect the ribbons 612 to the sockets 812 on the electrical controller 210. The optical controller 220 provides optical signals to the electrical controller 210 through the fiber optic interface 226 for controlling the power to individual connections in the socket 812. The combination of the optical controller 220 and electrical controller 210 allows any selection of individual spatially tunable heaters 140 to be simultaneously powered and or cycled on and off to create a desired temperature profile on a substrate disposed on the electrostatic chuck 132. The use of the high density interconnects enables independent control of a large number of spatially tunable heaters 140 and therefore enhanced control of the temperature profile. Advantageously, the independent control of the spatially tunable heaters 140 allows for a high duty cycle per individual spatially tunable heater 140 and a larger dynamic temperature range. Thus, the individual control of the spatially tunable heaters 140 provide more power per unit time along with a quick response time.

Figure 9:
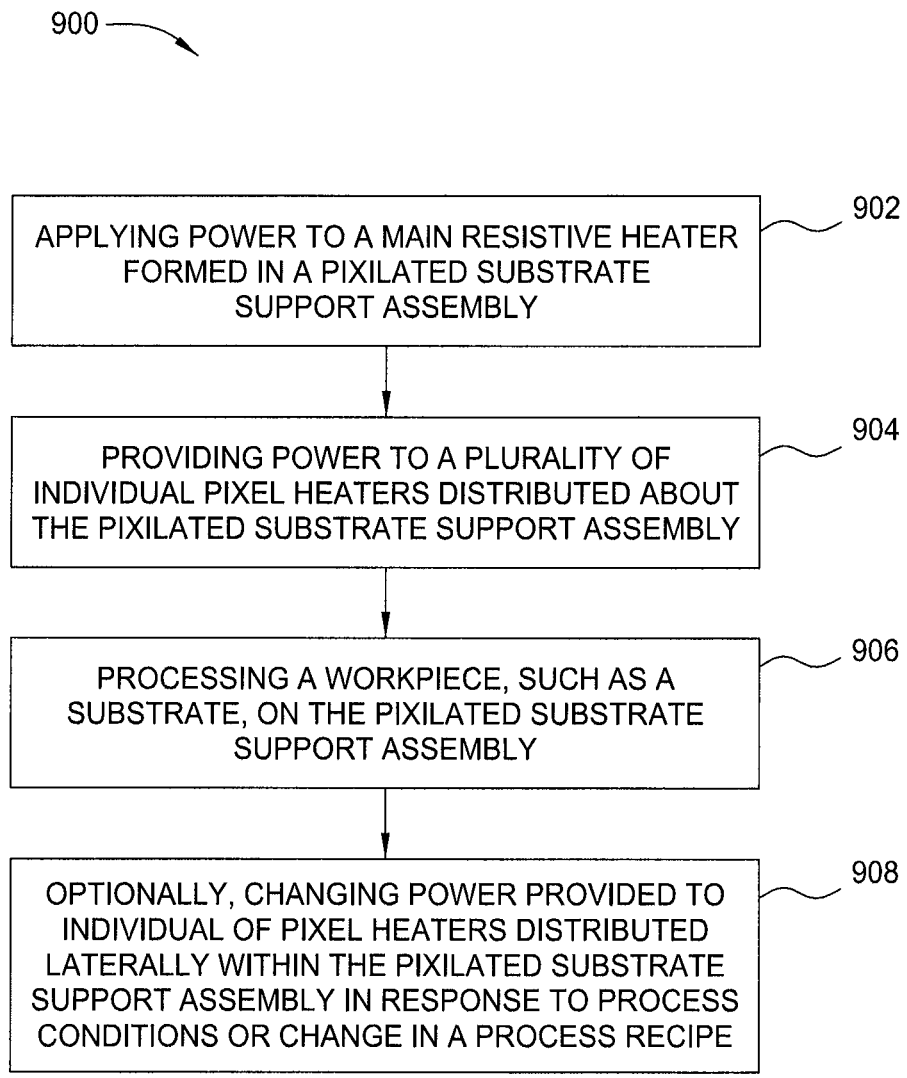
FIG. 9 is a flow diagram of one embodiment of a method for processing a substrate utilizing a substrate support assembly.

FIG. 9 is a flow diagram for one embodiment of a method 900 for processing a substrate utilizing a substrate support assembly, such as the substrate support assembly described above, among others. The method 900 begins at block 902 by applying power to a main resistive heater formed in a substrate support assembly. The main resistive heater may be a single heater, or segmented into zones. The main resistive heater zones may be independently controllable.

At block 904, power is provided to a plurality of individual spatially tunable heaters distributed about the substrate support assembly. A tuning heater controller individually controls power to each spatially tunable heater. At least two of the spatially tunable heaters generate a predetermined different amount of heat. The difference in heat generated by one spatially tunable heater relative another may be controlled by controlling at least one or more of the duty cycle, voltage, current, duration of power applied to any one spatially tunable heater relative another. The power supplied to the spatially tunable heaters may also be sequentially scanned across individual spatially tunable heaters.

The control for each spatially tunable heater can be performed simultaneous in the electrostatic chuck 132 allowing any selection of spatially tunable heaters to quickly generate a specific temperature profile. Control of the power provided to the individual spatially tunable heaters may be provide through an external controller interfacing over an optical connection to the tuning heater controller disposed in the substrate support assembly. Thus, the external controller is isolated from RF by the optical connection to the tuning heater controller.

At block 906, a workpiece, such as a substrate, may be processed on the substrate support assembly. For example, the substrate may be processed in a vacuum chamber, for example using a plasma process. The vacuum process, which may be optionally performed in the presence of a plasma within the processing chamber, may be one of etching, chemical vapor deposition, physical vapor deposition, ion implantation, plasma treating, annealing, oxide removal, abatement or other plasma process. It is contemplated that the workpiece may be processed on the temperature controlled surface in other environments, for example, at atmospheric conditions, for other applications.

Optionally, at block 906, power provided to the individual spatially tunable heaters distributed laterally within the substrate support assembly may be changed in response to process conditions or a change in a process recipe. For example, the power provided to one or more of spatially tunable heaters may be changed utilizing commands from the tuning heater controller. Thus, the tuning heater controller may simultaneously provide power to one spatially tunable heater while cycling another spatially tunable heater and cycling still other spatially tunable heaters at different overlapping time intervals.

While the foregoing is directed to implementations of the present invention, other and further implementations of the invention may be devised without departing from the basic scope thereof, and the scope thereof is determined by the claims that follow.

We claim:

1. A substrate support assembly, comprising:
a body having a substrate support surface and a lower surface;
one or more main resistive heaters disposed in the body;
a plurality of spatially tunable heaters disposed in the body; and
a spatially tunable heater controller coupled to the plurality of spatially tunable heaters, the spatially tunable heater controller configured to independently control an output one of the plurality of spatially tunable heaters relative to another of the plurality of spatially tunable heaters, wherein the spatially tunable heater controller comprises:
an electrical controller, wherein the electrical controller is configured to provide power individually to each spatially tunable heater; and
an optical controller connected to an external controller and configured to transmit instructions to the electrical controller for powering each spatially tunable heater.

2. The substrate support assembly of claim 1, wherein the body is an electrostatic chuck.

3. The substrate support assembly of claim 2, wherein the body is formed from a ceramic material.

4. The substrate support assembly of claim 1, wherein the body has vias formed therein between the spatially tunable heaters and a mounting surface of the body.

5. The substrate support assembly of claim 4, further comprising:
a plurality of high density connectors attached to the vias and disposed on the mounting surface.

6. The substrate support assembly of claim 5, wherein ribbons are soldered onto the high density connectors at the mounting surface of the body.

7. The substrate support assembly of claim 5, wherein a matting connector provides an electrical connection between the high density connectors at the mounting surface of the body and the spatially tunable heater controller.

8. The substrate support assembly of claim 1, further comprising:
a cooling base, wherein the cooling base has one or more slots formed there through.

9. The substrate support assembly of claim 1, wherein the spatially tunable heater controller has a single RF filter attached thereto.

10. The substrate support assembly of claim 1, wherein the spatially tunable heater controller is disposed below a bottom surface of the cooling base.

11. A substrate support assembly, comprising:
- a cooling base having a plurality of slots formed therethrough;
- a body having a substrate support surface and a lower surface;
- one or more main resistive heaters disposed in the body;
- a plurality of spatially tunable heaters disposed in the body;
- a plurality of high density conductors coupled to the spatially tunable heaters, the high density conductors extending through the slots formed through the cooling base; and
- a spatially tunable heater controller coupled by the plurality of high density conductors to the plurality of spatially tunable heaters, the spatially tunable heater controller having a single RF filter and configured to independently control an output for one of the plurality of spatially tunable heaters relative to another of the plurality of spatially tunable heaters, wherein the spatially tunable heater controller comprises;
  - an optical controller connected to an external controller and configured to transmit instructions for powering each spatially tunable heater.

12. The substrate support assembly of claim 11, wherein the body is an electrostatic chuck.

13. The substrate support assembly of claim 12, wherein the body is formed from a ceramic material.

14. The substrate support assembly of claim 12, wherein the body has vias formed therein between the spatially tunable heaters and a mounting surface of the body, and the high density connectors are soldered to the vias at the mounting surface of the body.

15. The substrate support assembly of claim 12, wherein the spatially tunable heater controller comprises:
- an electrical controller, wherein the electrical controller is configured to provide power individually to each spatially tunable heater and the optical controller configured to transmit instructions to the electrical controller for powering each spatially tunable heater, wherein the spatially tunable heater controller has the single RF filter attached thereto.

16. The substrate support assembly of claim 15, wherein the spatially tunable heater controller is disposed below a bottom surface of the cooling base.

17. A method for controlling a temperature of a workpiece, comprising:
- applying power to a main resistive heater formed in a substrate support;
- providing power to a plurality of spatially tunable heaters, wherein power to each spatially tunable heater is individually controlled by a tuning heater controller;
- processing the workpiece on the substrate support;
- changing the power provided to individual spatially tunable heater in response to process conditions or changes in a process recipe; and controlling the tuning heater controller to send power to each spatially tunable heater with an external controller isolated from RF by an optical connection to the tuning heater controller.

18. The method of claim 17, wherein the tuning heater controller simultaneously provides power to spatially tunable heaters at different overlapping time intervals.

* * * * *